(12) United States Patent
Wu et al.

(10) Patent No.: US 12,321,100 B2
(45) Date of Patent: *Jun. 3, 2025

(54) SEMICONDUCTOR LITHOGRAPHY SYSTEM AND/OR METHOD

(71) Applicant: TAIWAN SEMICONDUCTOR MANUFACTURING COMPANY LIMITED, Hsin-Chu (TW)

(72) Inventors: Tsiao-Chen Wu, Jhudong Township (TW); Chi-Ming Yang, Hsinchu (TW); Hsu-Shui Liu, Pingjhen (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/593,469

(22) Filed: Mar. 1, 2024

(65) Prior Publication Data

US 2024/0248412 A1 Jul. 25, 2024

Related U.S. Application Data

(63) Continuation of application No. 17/872,461, filed on Jul. 25, 2022, now Pat. No. 11,921,430, which is a continuation of application No. 17/189,371, filed on Mar. 2, 2021, now Pat. No. 11,402,761.

(60) Provisional application No. 63/029,040, filed on May 22, 2020.

(51) Int. Cl.
*G03F 7/00* (2006.01)
*G03F 7/20* (2006.01)

(52) U.S. Cl.
CPC ........ *G03F 7/70466* (2013.01); *G03F 7/2022* (2013.01); *G03F 7/70383* (2013.01)

(58) Field of Classification Search
CPC . G03F 7/70466; G03F 7/2022; G03F 7/70383
See application file for complete search history.

(56) References Cited

U.S. PATENT DOCUMENTS

| | | | |
|---|---|---|---|
| 5,929,976 A | 7/1999 | Shibuya et al. | |
| 7,078,323 B2 | 7/2006 | Hartzell | |
| 8,274,638 B2* | 9/2012 | Kato | G03F 7/70791 355/53 |
| 11,402,761 B2* | 8/2022 | Wu | G03F 7/2022 |
| 2004/0023137 A1* | 2/2004 | Duesman | G03F 7/70466 430/311 |
| 2009/0305165 A1 | 12/2009 | Inanami et al. | |
| 2015/0109597 A1* | 4/2015 | Schmitt | G02B 27/286 355/71 |

FOREIGN PATENT DOCUMENTS

| | | |
|---|---|---|
| CN | 101369102 A | 2/2009 |
| TW | 200416498 A | 9/2004 |

* cited by examiner

*Primary Examiner* — Hung V Nguyen
(74) *Attorney, Agent, or Firm* — Cooper Legal Group, LLC

(57) ABSTRACT

A lithography method to pattern a first semiconductor wafer is disclosed. An optical mask is positioned over the first semiconductor wafer. A first region of the first semiconductor wafer is patterned by directing light from a light source through transparent regions of the optical mask. A second region of the first semiconductor wafer is patterned by directing energy from an energy source to the second region, wherein the patterning of the second region comprises direct-beam writing.

20 Claims, 11 Drawing Sheets

SEMICONDUCTOR LITHOGRAPHY SYSTEM AND/OR METHOD

RELATED APPLICATION

This application is a continuation of and claims priority to U.S. Non-Provisional patent application Ser. No. 17/872,461, titled "SEMICONDUCTOR LITHOGRAPHY SYSTEM AND/OR METHOD" and filed on Jul. 25, 2022, which is a continuation of and claims priority to U.S. Non-Provisional patent application Ser. No. 17/189,371, titled "SEMICONDUCTOR LITHOGRAPHY SYSTEM AND/OR METHOD" and filed on Mar. 2, 2021, which claims priority to U.S. Provisional Patent Application 63/029,040, titled "Novel Pattern Density Adjustment" and filed on May 22, 2020. U.S. Non-Provisional patent application Ser. No. 17/872,461, U.S. Non-Provisional patent application Ser. No. 17/189,371, and U.S. Provisional Patent Application 63/029,040 are incorporated herein by reference.

BACKGROUND

Semiconductor manufacturing techniques include forming semiconductor dies from semiconductor wafers. Many dies are formed from a single wafer. A die may include a semiconductor circuit and/or a semiconductor device formed by subjecting a wafer to semiconductor processing techniques such as photolithography. After dies are formed, the wafer is sliced to physically separate the individual dies from one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
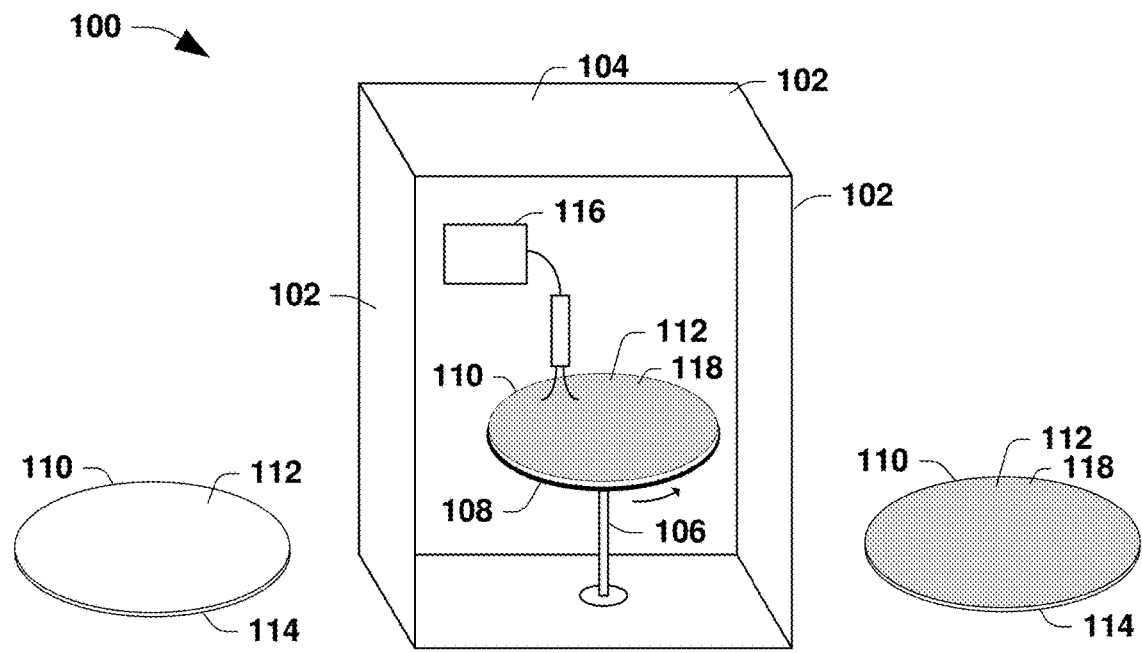
FIG. 1 illustrates a resist chamber for semiconductor wafer lithography, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more apparatuses and/or methods for semiconductor wafer lithography are provided herein. The one or more apparatuses and/or methods may be implemented in or by a lithography system. The lithography system comprises lithography stations, including a photolithography station and a direct-beam write (mask-less lithography) station.

An optical mask, such as a photomask, overlies a wafer. An area directly under the photomask defines a first region of the wafer. The first region is a photolithographic region of the wafer affected by light that passes through transparent regions of the optical mask to write a photolithographic pattern within the first region. An area between the first region of the wafer and an edge of the wafer defines a second region of the wafer. The second region is a direct-beam write region of the wafer affected by energy from an energy beam to write a mask-less lithographic pattern within the second region.

According to some embodiments, the photolithographic pattern is written within the first region of the wafer at the photolithographic station of the lithography system. The wafer is transferred to the direct-beam write station. The mask-less lithographic pattern is written within the second region of the wafer at the direct-beam write station.

According to some embodiments, a density of the mask-less lithographic pattern is adjustable based on a density of the photolithographic pattern.

According to some embodiments, a first wafer is transferred from a wafer holder to a first station, such as the photolithographic station, for photolithographic writing within the first region. After photolithographic writing within the first region, the first wafer is transferred from the first station to a second station, such as the direct-beam write station, for direct-beam writing within the second region of the first wafer. While or after the first wafer is transferred from the first station to the second station, a second wafer is transferred to the first station for photolithographic writing within a first region of the second wafer. According to some embodiments, the first region of the second wafer is photolithographically written to at the first station concurrent with direct-beam writing within the second region of the first wafer at the second station.

Because the first wafer is transferred to the direct-beam write station for writing the mask-less lithographic pattern within the second region of the first wafer, the amount of time the first wafer occupies the first station is reduced, compared to systems in which all regions of the wafer are written to at a single station, such as the first station.

FIG. 1 illustrates a resist chamber 100 for semiconductor wafer lithography, according to some embodiments. The resist chamber 100 comprises surfaces 102 defining a resist chamber housing 104. The resist chamber housing 104 comprises a spin coater 106. The spin coater 106 may comprise a first wafer holder 108 to support a wafer 110, such as a semiconductor wafer. The wafer 110 comprises a first surface 112 and a second surface 114. The first surface 112 is an upper surface of the wafer 110 and the second surface 114 is an underside surface of the wafer 110, opposite the first surface 112. The wafer 110 is a substrate comprising a material suitable for patterning, etching, deposition, or other die formation processes. The substrate comprises a semiconductor material such as silicon, gallium arsenide, gallium nitride, silicon carbide, or other suitable materials. Other configurations or compositions of the wafer 110 are within the scope of the present disclosure.

According to some embodiments, the first wafer holder 108 is at least one of a platter, a mechanical chuck, an electrostatic chuck, a vacuum chuck, a stepper chuck, a porous chuck, or other suitable devices to support the wafer 110. The first wafer holder 108 comprises at least one of ceramic, glass, aluminum, bronze, or other suitable materials. The first wafer holder 108 may comprise lift pins (not shown) to raise and lower the wafer 110 for processing. Other configurations of the first wafer holder 108 are within the scope of the present disclosure.

The resist chamber 100 comprises a dispenser 116 to dispense a resist material 118 over the first surface 112. The resist material 118 is at least one of a photoresist material or other materials affected by light, an electron-sensitive material, an electron beam resist material, a material affected by energy, or other suitable materials affected by light or energy. In some embodiments, properties such as solubility of the resist material 118 are affected by light or energy. In some embodiments, at least one of the spin coater 106 or the dispenser 116 are configured to establish and/or undergo relative movement between the wafer 110 and the dispenser 116. In FIG. 1, the wafer 110 prior to spin coating the resist material 118 is illustrated to the left of the resist chamber housing 104. The wafer 110 after spin coating the resist material 118 is illustrated to the right of the resist chamber housing 104. After spin coating, the resist material 118 overlies the first surface 112 of the wafer 110. Other configurations of the resist chamber 100 are within the scope of the present disclosure.

Figure 2:
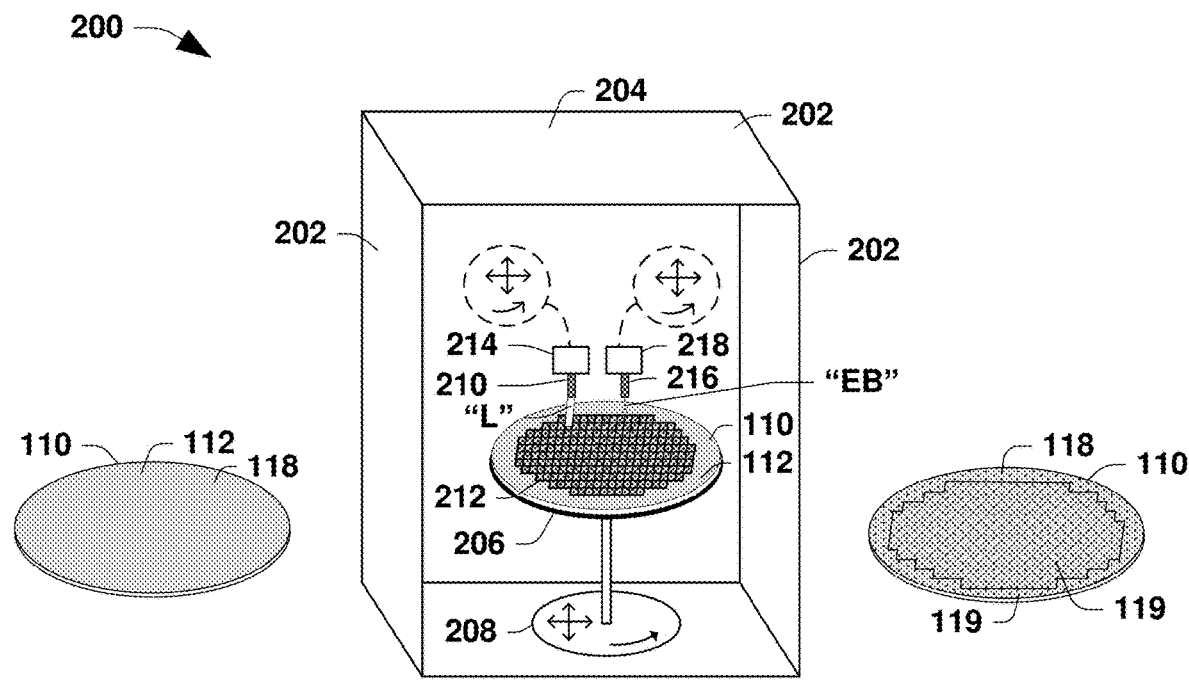
FIG. 2 illustrates a lithography chamber for semiconductor wafer lithography, according to some embodiments.

FIG. 2 illustrates a lithography chamber 200 for semiconductor wafer lithography, according to some embodiments. The lithography chamber 200 comprises surfaces 202 defining a lithography chamber housing 204. The lithography chamber housing 204 comprises a second wafer holder 206 to support the wafer 110. According to some embodiments, the second wafer holder 206 is at least one of a platter, a mechanical chuck, an electrostatic chuck, a vacuum chuck, a stepper chuck, a porous chuck, or other suitable devices to support the wafer 110. The second wafer holder 206 comprises at least one of ceramic, glass, aluminum, bronze, or other suitable materials. The second wafer holder 206 may comprise lift pins (not shown) to raise and lower the wafer 110 for processing. Other configurations of the second wafer holder 206 are within the scope of the present disclosure.

According to some embodiments, the second wafer holder 206 is coupled to a first conveyer 208 to at least one of shift, move, or rotate the second wafer holder 206 for lithography processes.

According to some embodiments, the lithography chamber 200 comprises a light source 210 over the second wafer holder 206 to project light "L" to the first surface 112 or to an optical mask 212 over the first surface 112. In some embodiments, the first surface 112 comprises, or has formed there-over, at least one of the resist material 118, a same material as the resist material 118, a light-sensitive material, an energy-sensitive material, or other suitable materials. The light source 210 may be at least one of a photolithography light source, a visible light source, an ultraviolet light source, a deep ultraviolet light source, an extreme ultraviolet light source, a 193 nanometer (nm) light source, a 1022 nm light source, a 365 nm light source, a 436 nm light source, or other suitable light sources. According to some embodiments, the light source 210 is coupled to a second conveyer 214 to at least one of move, shift, or rotate the light source 210 for photolithographic patterning. Other configurations of the light source 210 are within the scope of the present disclosure.

According to some embodiments, the lithography chamber 200 comprises an energy source 216 to direct-beam write into an energy sensitive material overlying the first surface 112. The energy source 216 directs an energy beam "EB" to the first surface 112 or to an energy sensitive material overlying the first surface 112 outside an area of the optical mask 212. Directing the energy beam "EB" to the first surface 112 or to an energy sensitive material overlying the first surface 112 outside an area of the optical mask 212 is mask-less lithography. In some embodiments, the energy sensitive material is at least one of the resist material 118, a same material as the resist material 118, a light-sensitive material, an energy-sensitive material, or other suitable materials. The energy source 216 may be at least one of a light source, an electron beam source, a thermionic source, a focused-ion beam source, a laser source, or other suitable energy sources. According to some embodiments, the energy source 216 is coupled to a third conveyer 218 to at least one of shift, move, or rotate the energy source 216 to direct-beam write into the energy sensitive material. Other configurations of the energy source 216 are within the scope of the present disclosure.

In FIG. 2, the wafer 110 prior to exposure to the light "L" and the energy beam "EB" is illustrated to the left of the lithography chamber housing 204. The wafer 110 after exposure to the light "L" and the energy beam "EB" is illustrated to the right of the lithography chamber housing 204, according to some embodiments. After exposure to the light "L" and the energy beam "EB" the resist material 118 has patterned regions 119. Other configurations of the lithography chamber 200 are within the scope of the present disclosure.

Figure 3:
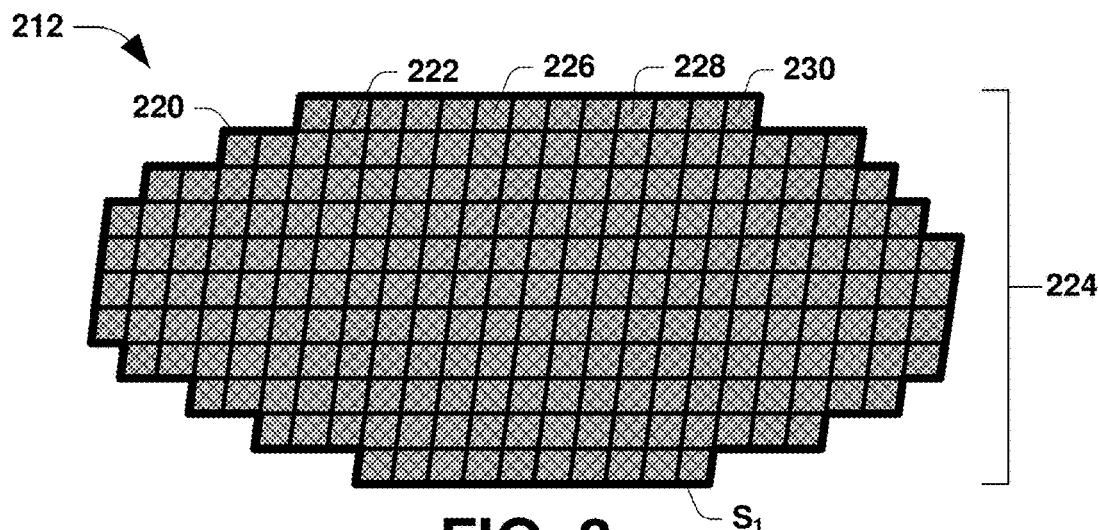
FIG. 3 illustrates an optical mask for semiconductor wafer lithography, according to some embodiments.

FIG. 3 illustrates the optical mask 212 for semiconductor wafer lithography, according to some embodiments. The optical mask 212 comprises an optical mask boundary 220 and die boundaries 222. In some embodiments, the optical mask boundary 220 is a full or partial exposure field of the optical mask 212. A shape $S_1$ of the optical mask 212 may be elliptical, polygonal, an arrangement of elliptical and/or polygonal shapes, or other suitable shapes. In some embodiments, the optical mask 212 is a patterned plate with transparent and light absorption regions, a photomask, a reticle, or other devices having transparent and light absorption regions. Other configurations of the optical mask 212 are within the scope of the present disclosure.

The die boundaries 222 define an arrangement 224 of photolithographic die patterns 226, including a first photolithographic die pattern 228 and a second photolithographic die pattern 230. The arrangement 224 may be one-dimensional, two-dimensional, symmetrical, asymmetrical, or other suitable shapes. The first photolithographic die pattern 228 may be different than or the same as the second photolithographic die pattern 230. The first photolithographic die pattern 228 may comprise transparent regions that have a same shape as transparent regions of the second photolithographic die pattern 230. The first photolithographic die pattern 228 may comprise transparent regions that have a different shape as transparent regions of the second photolithographic die pattern 230. The first photolithographic die pattern 228 may comprise transparent regions at locations that are the same as locations of transparent regions of the second photolithographic die pattern 230. The first photolithographic die pattern 228 may comprise transparent regions at locations that are different from locations of transparent regions of the second photolithographic die pattern 230. Other configurations of the photolithographic die patterns 226 are within the scope of the present disclosure.

Figure 4A:
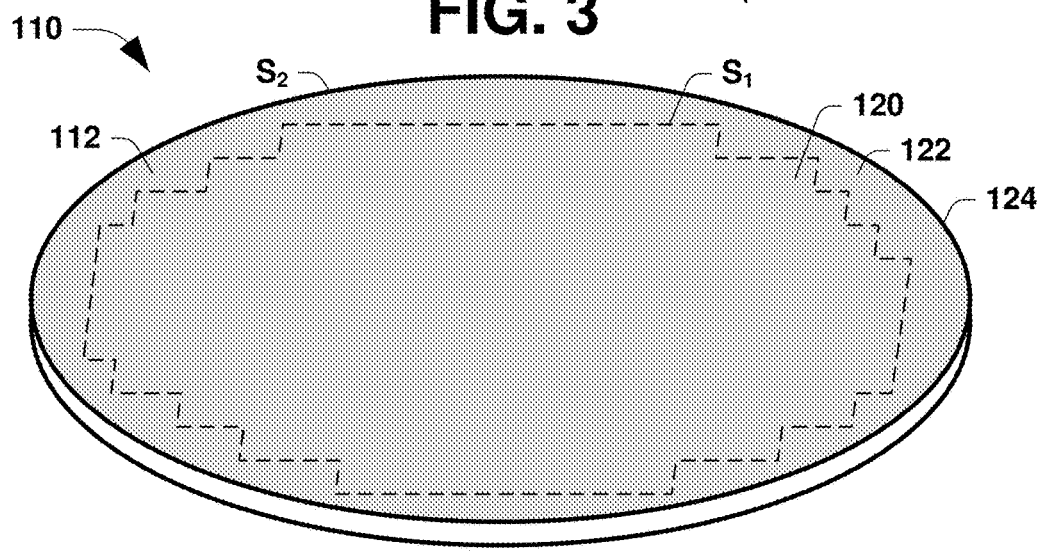
FIGS. 4A-4B illustrate regions of a wafer for semiconductor wafer lithography, according to some embodiments.
Figure 4B:
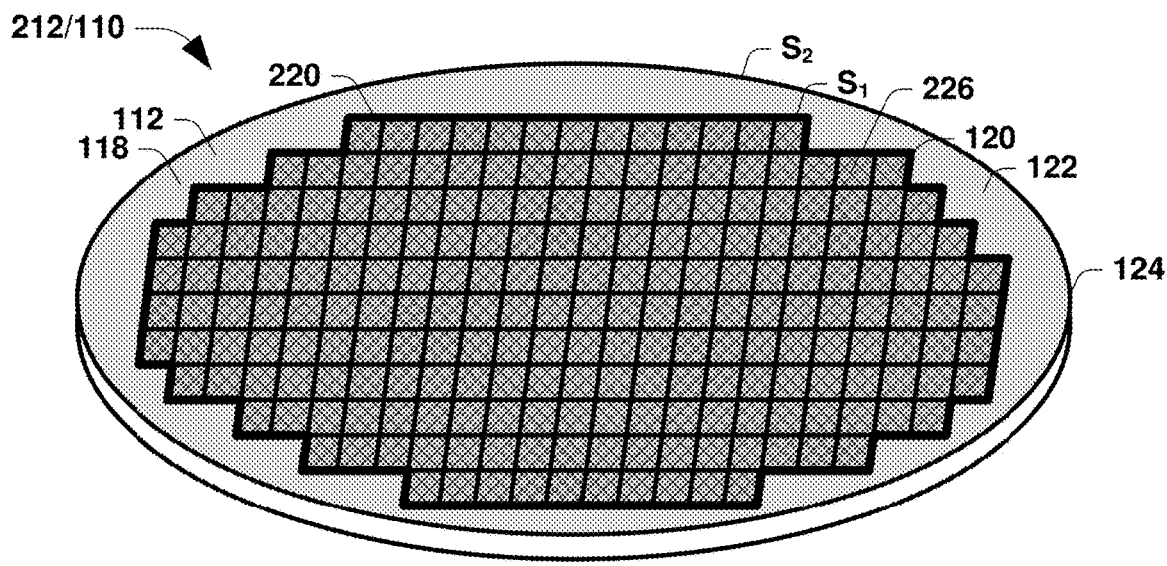

FIGS. 4A-4B illustrate regions of the wafer 110 for semiconductor wafer lithography, according to some embodiments. A first region 120 of the wafer 110 corresponds to the shape $S_1$ of the optical mask 212 and a second region 122 of the wafer 110 encompasses an area between the first region 120 and an edge 124 of the wafer 110. The second region 122 may fully encircle the first region 120. The second region 122 may partially encircle the first region 120. The second region 122 may be continuous or segmented. In some embodiments, the shape $S_1$ does not intersect the edge 124. In some embodiments, the shape $S_1$ intersects the edge 124 at least at one location. According to some embodiments, a difference between a shape $S_2$ of the wafer 110 and the shape $S_1$ of the optical mask 212 defines a shape of the second region 122. The shape $S_2$ of the wafer 110 may be the same as or different than the shape $S_1$ of the optical mask 212. A size of the shape $S_2$ may be greater or less than a size of the shape $S_1$. Other geometrical relationships between the wafer 110 and the optical mask 212 are within the scope of the present disclosure.

FIG. 4B illustrates the optical mask 212 positioned over the wafer 110, or rather over the resist material 118 formed on the wafer 110. Each of the photolithographic die patterns 226 may be within the first region 120 of the wafer 110. According to some embodiments, the first region 120 is a photolithography region and the second region 122 is an exclusion zone between the optical mask boundary 220 and the edge 124 of the wafer 110. The resist material 118 overlies the first surface 112.

The resist material 118 is either a negative resist material or a positive resist material. With respect to the negative resist material, regions of the negative resist material become insoluble when illuminated by light received from a light source through the transparent regions of the photolithographic die patterns 226. Application of a solvent to the negative resist material during a subsequent development stage removes non-illuminated regions of the negative resist material. In some embodiments, the solvent is a developer. A pattern formed in the negative resist material is thus a negative of a pattern defined by the transparent regions of the photolithographic die patterns 226. With respect to the positive resist material, illuminated regions of the positive resist material become soluble and are removed via application of the solvent during development. Thus, a pattern formed in the positive resist material is a positive image of transparent regions of the photolithographic die patterns 226.

In some embodiments, an etchant (not shown) is applied after the pattern is formed in the resist material 118. The etchant may be at least one of a wet-etch material, a dry-etch material, or other etch materials having a selectivity such that the etchant removes or etches away portions of the wafer 110 or one or more layers on or of the wafer 110 that are not protected by portions of the resist material 118 remaining after the resist material is patterned. Accordingly, an opening in the resist material 118 allows the etchant to form a corresponding opening in the wafer 110 or layer(s) on or of the wafer 110 under the opening in the resist material 118. According to some embodiments, further wafer 110 processing includes stripping or washing away the resist material 118 from the first surface 112.

Figure 5:
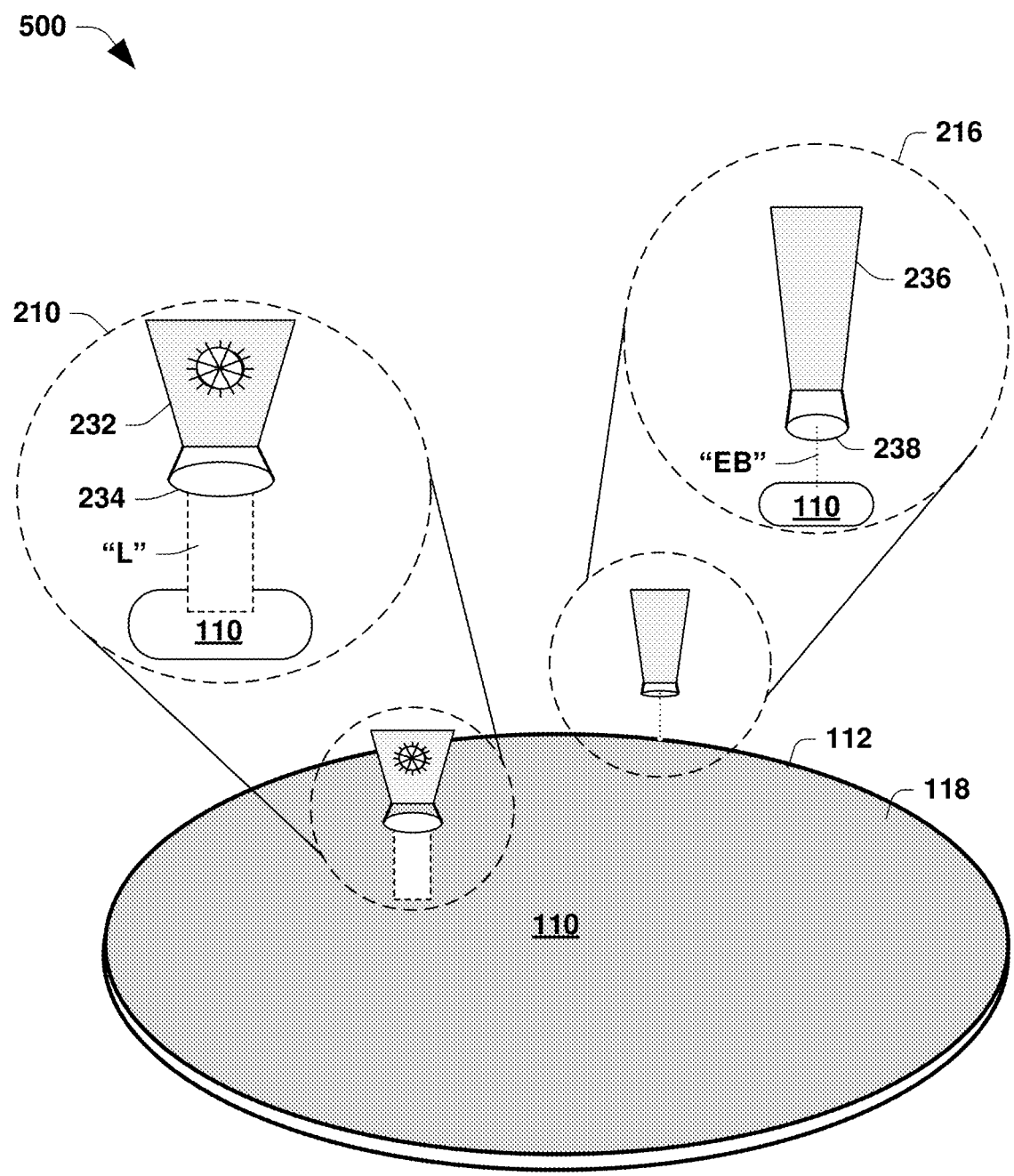
FIG. 5 illustrates a lithography system for semiconductor wafer lithography, according to some embodiments.

FIG. 5 illustrates a lithography system 500 for semiconductor wafer lithography, according to some embodiments. The lithography system 500 is disposed over the first surface 112 of the wafer 110, where the first surface 112 comprises and/or has formed thereover the resist material 118. The lithography system 500 comprises the light source 210 over the wafer 110. The light source 210 comprises a light emitter 232. In some embodiments, the light emitter 232 is at least one of a gas-discharge lamp, a mercury lamp, an excimer laser, a free-electron laser, or other suitable light emitting devices. Other configurations of the light source 210 are within the scope of the present disclosure.

The lithography system 500 includes an optical device 234 under the light emitter 232, according to some embodiments. The optical device 234 at least one of focuses, directs, or disperses light emitted from the light emitter 232 onto the photolithographic die patterns 226 over the wafer 110. In some embodiments, the optical device 234 may direct light emitted from the light emitter 232 into a light beam suitable for scanning a die pattern over the wafer 110. The optical device 234 may be at least one of an optical lens, a single lens, a compound lens, a projection lens, a reduction lens, or other suitable optical devices. Other configurations of the optical device 234 are within the scope of the present disclosure.

The lithography system 500 comprises the energy source 216 over the wafer 110. The energy source 216 comprises an energy emitter 236. In some embodiments, the energy emitter 236 is at least one of an electron beam emitter, a light emitter, a gas-discharge lamp, a mercury lamp, an excimer laser, a free-electron laser, or other suitable light or energy emitting devices. The energy emitter 236 may be a single or multi-beam emitter. Other configurations of the energy source 216 are within the scope of the present disclosure.

The lithography system 500 comprises an energy/light trajectory device 238 under the energy emitter 236, according to some embodiments. The energy/light trajectory device 238 at least one of focuses, directs, or disperses energy or light emitted from the energy emitter 236 onto areas of the first surface 112. In some embodiments, the energy/light trajectory device 238 may direct energy or light emitted from the energy emitter 236 into the energy beam "EB" to direct-beam write a pattern or other traces (hereinafter collectively referred to as "pattern(s)") into a material overlying the wafer 110. The energy/light trajectory device 238 may be at least one of an electron focusing lens, an ion focusing lens, a coherent light focusing lens, an optical lens, a single lens, a compound lens, a projection lens, a reduction lens, or other suitable devices for directing energy and/or light. Other configurations of the energy/light trajectory device 238 are within the scope of the present disclosure.

Figure 6:
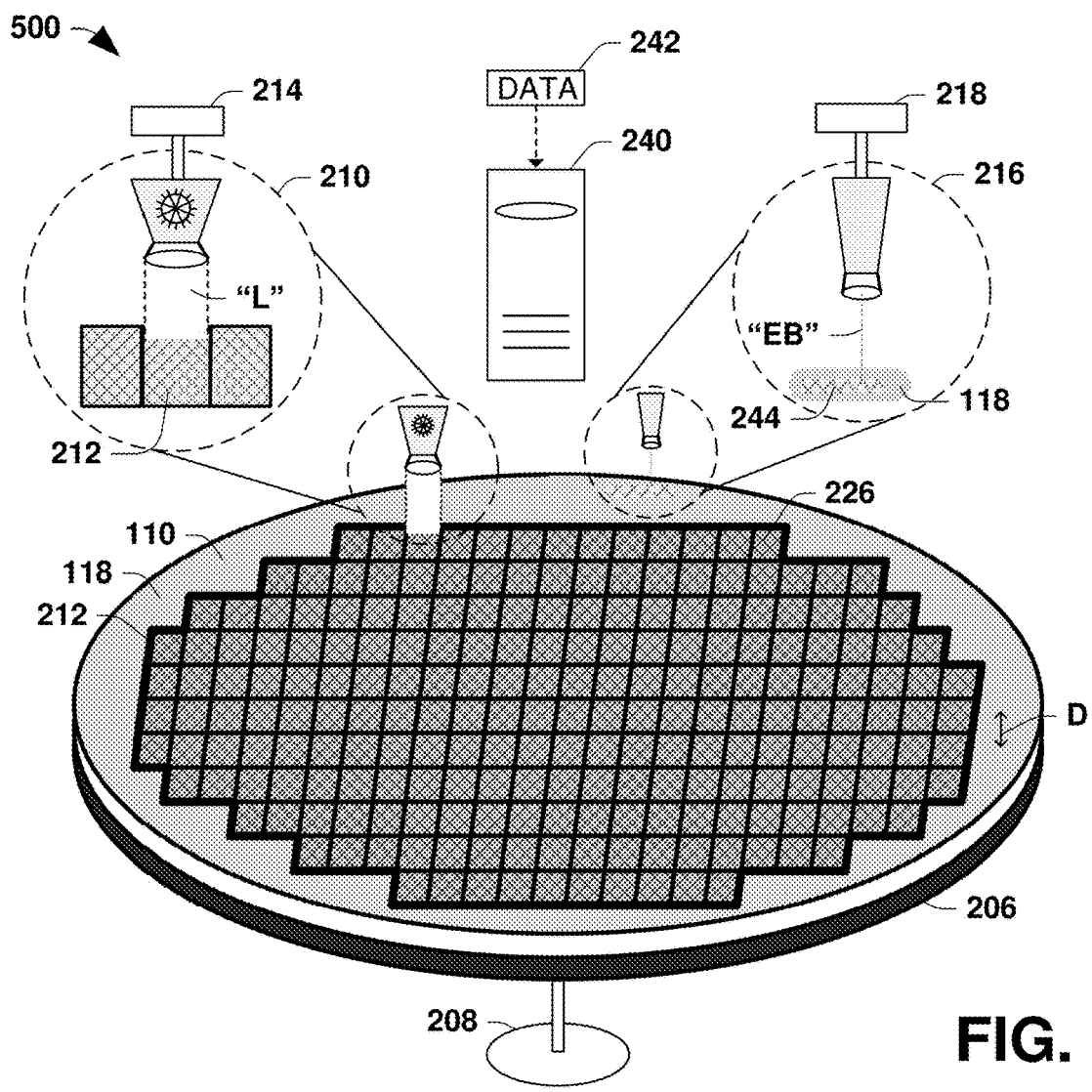
FIG. 6 illustrates a lithography system for semiconductor wafer lithography, according to some embodiments.

FIG. 6 illustrates the lithography system 500 for semiconductor wafer lithography, according to some embodiments. Several features of the lithography system 500 of FIG. 6 are the same as or similar to features of the lithography system 500 illustrated and described with reference to FIG. 5. Descriptions and methods of formation of the same or similar features in FIG. 5 are omitted, at least, to avoid repetition of disclosure.

According to some embodiments, the lithography system 500 comprises the optical mask 212 and the wafer 110. The wafer 110 overlies the second wafer holder 206, and the optical mask 212 is over the wafer 110. In some embodiments, the optical mask 212 is in contact with the wafer 110. In some embodiments, the optical mask 212 is separated a distance "D" from the wafer 110 by an optical mask holder (not shown).

In some embodiments, the first conveyer 208 is coupled to the second wafer holder 206 and/or the optical mask holder to maneuver the optical mask 212 and/or the wafer 110 relative to a location of the light "L" emitted from the light source 210. The first conveyer 208 may drive the second wafer holder 206 and/or the optical mask holder such that the light "L" scans or steps through the photolithographic die patterns 226 and impinges upon the resist material 118 overlying the wafer 110. In some embodiments, the second conveyer 214 is coupled to the light source 210 to drive the light source 210 relative to locations and orientations of the photolithographic die patterns 226. The light source 210 may be driven by the second conveyer 214 to scan or step through each of the photolithographic die patterns 226. In some embodiments, the first conveyer 208 drives the second wafer holder 206 and/or the optical mask holder and the second conveyer 214 concurrently drives the light source 210 to scan or step through the photolithographic die patterns 226. Other configurations of one or more conveyers to drive the second wafer holder 206, the optical mask holder, and/or the light source 210 are within the scope of the present disclosure.

In some embodiments, the first conveyer 208 is coupled to the second wafer holder 206 to maneuver the wafer 110 relative to a location of the energy beam "EB" emitted by the energy source 216. The first conveyer 208 may drive the second wafer holder 206 to direct-beam write a first pattern 244 into the resist material 118 overlying the wafer 110. In some embodiments, the third conveyer 218 is coupled to the energy source 216 to drive the energy source 216 to direct-beam write patterns into the resist material 118. In some embodiments, the first conveyer 208 drives the second wafer holder 206 and the third conveyer 218 concurrently drives the energy source 216 to direct-beam write patterns into the resist material 118. Other configurations of one or more conveyers to drive the second wafer holder 206 and/or the energy source 216 are within the scope of the present disclosure.

In some embodiments, the lithography system 500 comprises a first lithography station and a second lithography station (not shown). The first lithography station comprises the light source 210 and the second conveyer 214. The second lithography station comprises the energy source 216 and the third conveyer 218. Other configurations of the lithography system 500 are within the scope of the present disclosure.

The lithography system 500 includes or is in communication with a controller 240. According to some embodiments, the controller 240 is programmed with or receives lithography data from a lithography data source 242. The lithography data may include photolithography pattern data and/or direct-beam write data. In some embodiments, the controller 240 communicates signals to the first conveyer 208 to control a first position, a first orientation, and/or a first movement of the wafer 110 and/or the optical mask 212. First movement signals may include a first movement rate and/or first movement direction signals. In some embodiments, the controller 240 communicates signals to the second conveyer 214 to control a second position, a second orientation, and/or a second movement of the light source 210. Second movement signals may include a second movement rate and/or second movement direction signals. In some embodiments, the controller 240 communicates signals to the third conveyer 218 to control a third position, a third orientation, and/or a third movement of the energy source 216. Third movement signals may include a third movement rate and/or third movement direction signals. Other configurations and/or programming of the controller 240 are within the scope of the present disclosure.

The lithography data may include data directed to exposing the optical mask 212 to light from the light source 210 prior to direct-beam writing a pattern into the resist material 118. The lithography data may include data directed to exposing the optical mask 212 to light from the light source 210 after direct-beam writing a pattern into the resist material 118. The lithography data may include data directed to a wavelength, amplitude, frequency, duration, etc. of light from the light source 210 and/or energy from the energy source 216. Other types of lithography data are within the scope of the present disclosure.

Figure 7:
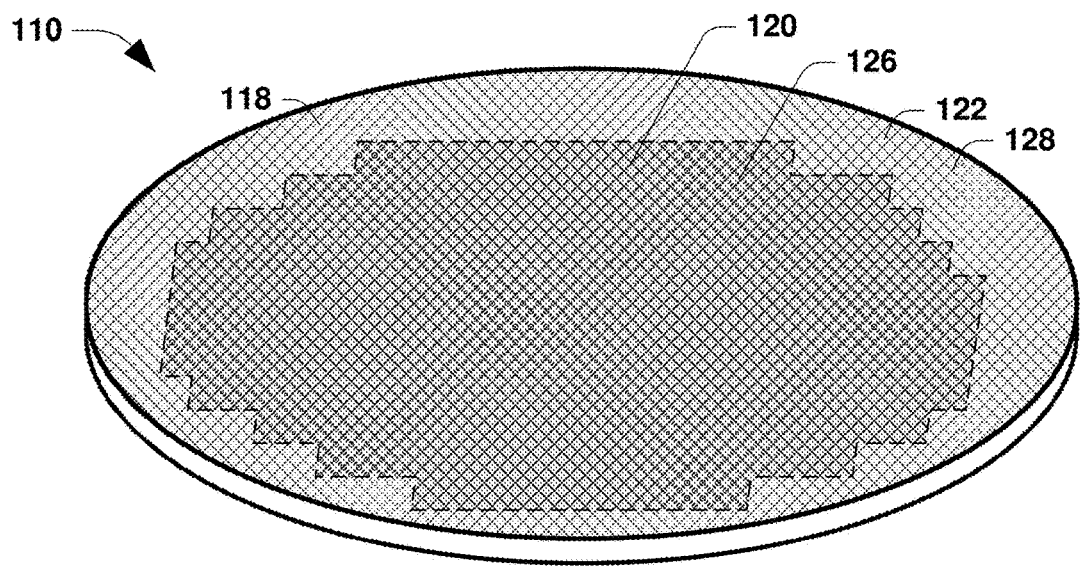
FIG. 7 illustrates a wafer after semiconductor wafer lithography, according to some embodiments.

FIG. 7 illustrates the wafer 110 after semiconductor wafer lithography, according to some embodiments. Lithography may include exposing the photolithographic die patterns 226 of the optical mask 212 to light and/or direct-beam writing a pattern in the resist material 118. At least a portion of the first region 120 of the wafer 110 is a first patterned region 126, and at least a portion of the second region 122 of the wafer 110 is a second patterned region 128. The first patterned region 126 may have a same or a different shape as a shape of the optical mask 212. The second patterned region 128 may have a same or a different shape as a shape of the second region 122. In FIG. 7, the first patterned region 126 has a same shape as a shape of the optical mask 212 and the second patterned region 128 has a same shape as a shape of the second region 122. Other patterning arrangements of the first region 120 and/or the second region 122 are within the scope of the present disclosure.

In some embodiments, a pattern of the first patterned region 126 is the same as a pattern of the second patterned region 128. In some embodiments, a pattern of the first patterned region 126 is different than a pattern of the second patterned region 128. In some embodiments, patterns of portions of the first patterned region 126 are the same as patterns of portions of the second patterned region 128. In some embodiments, patterns of portions of the first patterned region 126 are different than patterns of portions of the second patterned region 128. In some embodiments, at least some of the pattern of the second patterned region 128 is a dummy pattern. In some embodiments, at least some of the pattern of the second patterned region 128 is a Manhattan dummy pattern and/or a non-Manhattan dummy pattern. Other arrangements of the first patterned region 126 and/or the second patterned region 128 are within the scope of the present disclosure.

Figure 8:
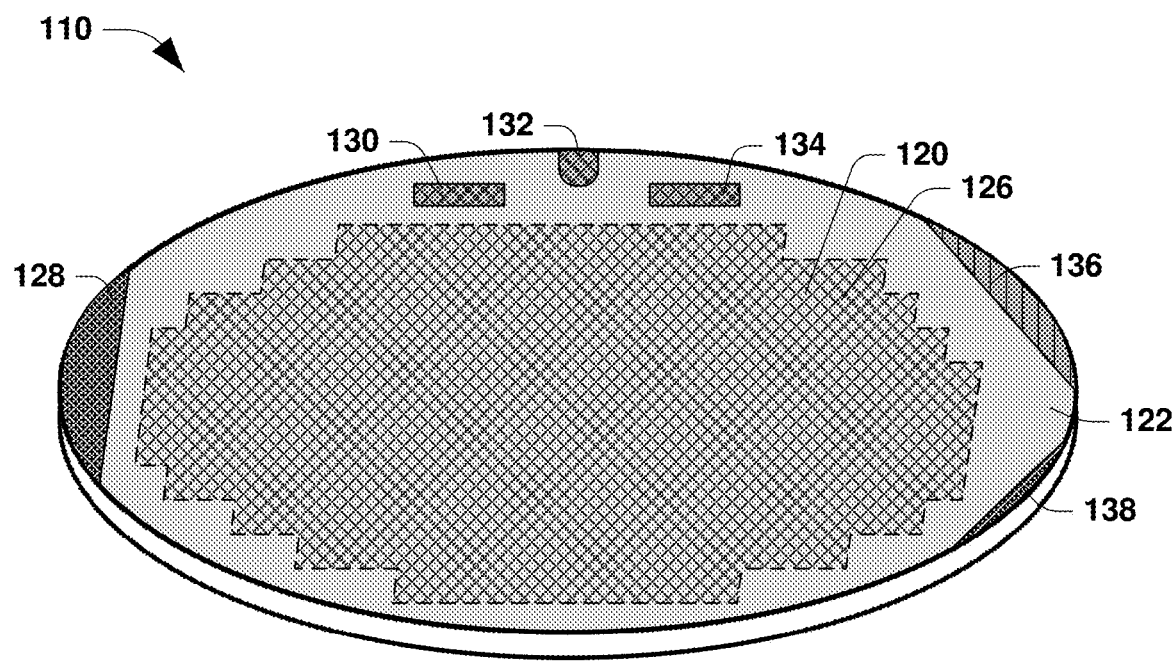
FIG. 8 illustrates a wafer after semiconductor wafer lithography, according to some embodiments.

FIG. 8 illustrates the wafer 110 after semiconductor wafer lithography, according to some embodiments. At least a portion of the first region 120 of the wafer 110 is the first patterned region 126, and the second region 122 of the wafer 110 includes the second patterned region 128, a third patterned region 130, a fourth patterned region 132, a fifth patterned region 134, a sixth patterned region 136, and a seventh patterned region 138, according to some embodiments. In some embodiments, the second patterned region 128, the third patterned region 130, the fourth patterned region 132, the fifth patterned region 134, the sixth patterned region 136, and the seventh patterned region 138 may be between the first patterned region 126 and the edge 124 of the wafer 110.

In some embodiments, a shape of some of the second patterned region 128, the third patterned region 130, the fourth patterned region 132, the fifth patterned region 134, the sixth patterned region 136, and the seventh patterned region 138 is a same shape as a shape of some other of the second patterned region 128, the third patterned region 130, the fourth patterned region 132, the fifth patterned region 134, the sixth patterned region 136, and the seventh patterned region 138. In some embodiments, a shape of some of the second patterned region 128, the third patterned region 130, the fourth patterned region 132, the fifth patterned region 134, the sixth patterned region 136, and the seventh patterned region 138 is different than a shape of some other of the second patterned region 128, the third patterned region 130, the fourth patterned region 132, the fifth patterned region 134, the sixth patterned region 136, and the seventh patterned region 138. In some embodiments the third patterned region 130 and the fifth patterned region 134 have a same shape, and each of the second patterned region 128, the fourth patterned region 132, the sixth patterned region 136, and the seventh patterned region 138 have different shapes than shapes of the third patterned region 130 and the fifth patterned region 134.

In some embodiments, a pattern of some of the first patterned region 126, the second patterned region 128, the third patterned region 130, the fourth patterned region 132, the fifth patterned region 134, the sixth patterned region 136, or the seventh patterned region 138 is a same pattern as a pattern of another of the first patterned region 126, the second patterned region 128, the third patterned region 130, the fourth patterned region 132, the fifth patterned region 134, the sixth patterned region 136, or the seventh patterned region 138. In some embodiments, a pattern of some of the first patterned region 126, the second patterned region 128, the third patterned region 130, the fourth patterned region 132, the fifth patterned region 134, the sixth patterned region 136, or the seventh patterned region 138 is different than a pattern of another of the first patterned region 126, the second patterned region 128, the third patterned region 130, the fourth patterned region 132, the fifth patterned region 134, the sixth patterned region 136, or the seventh patterned region 138. In some embodiments patterns of the third patterned region 130, the fourth patterned region 132, and the fifth patterned region 134 are the same, and patterns of each of the first patterned region 126, the second patterned region 128, the sixth patterned region 136, and the seventh patterned region 138 are different than the patterns of the third patterned region 130, the fourth patterned region 132, and the fifth patterned region 134. Other arrangements of the first region 120 and/or the second region 122, such as different numbers, shapes, sizes, locations, and/or patternings, etc. of regions and/or patterned regions, are within the scope of the present disclosure.

Figure 9:
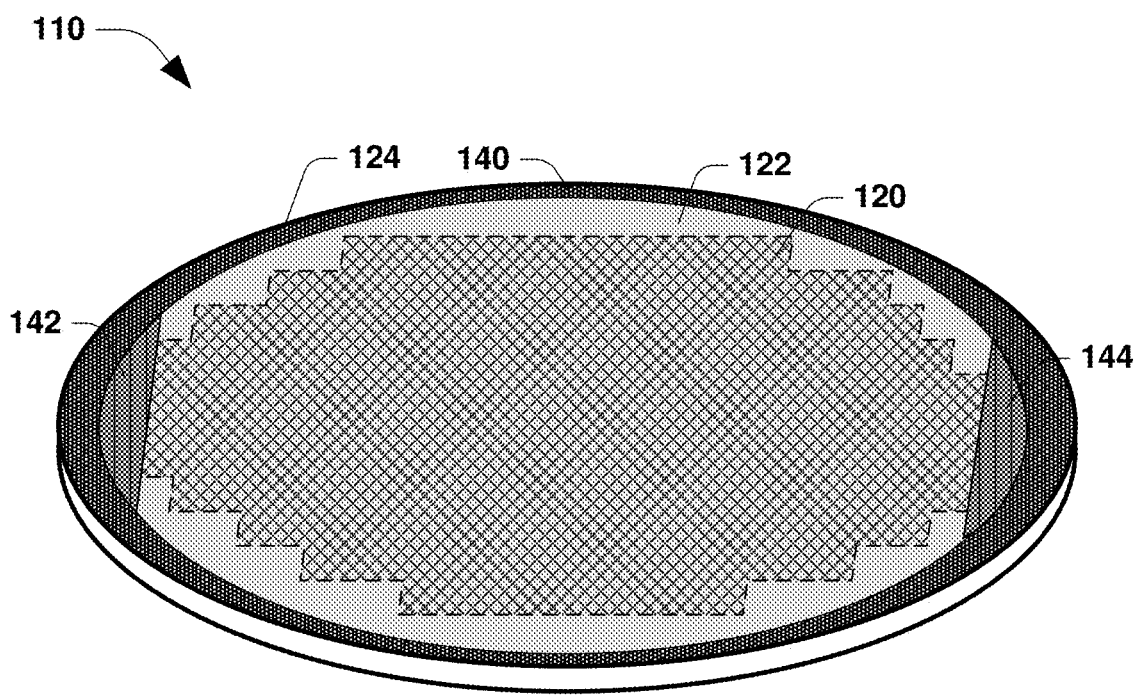
FIG. 9 illustrates a wafer after semiconductor wafer lithography, according to some embodiments.

FIG. 9 illustrates the wafer 110 after semiconductor wafer lithography, according to some embodiments. At least a portion of the first region 120 of the wafer 110 is patterned and regions of the second region 122 are patterned. In some embodiments, the second region 122 may comprise an eighth patterned region 140 between the first region 120 and the edge 124 of the wafer 110, a ninth patterned region 142 between the first region 120 and the eighth patterned region 140, and a tenth patterned region 144 between the first region 120 and the eighth patterned region 140. Other arrangements of the first region 120 and/or the second region 122 of the wafer 110 are within the scope of the present disclosure.

In some embodiments, a shape of some of the first region 120, the eighth patterned region 140, the ninth patterned region 142, or the tenth patterned region 144 is a same shape as a shape of some other of the first region 120, the eighth patterned region 140, the ninth patterned region 142, or the tenth patterned region. In some embodiments, a shape of some of the first region 120, the eighth patterned region 140, the ninth patterned region 142, or the tenth patterned region 144 is different than a shape of some other of the first region 120, the eighth patterned region 140, the ninth patterned region 142, or the tenth patterned region. Other arrangements of shapes of patterned regions of the wafer 110 are within the scope of the present disclosure.

In some embodiments, a pattern of the first region 120 or of some patterned portions of the second region 122 is a same pattern as a pattern of another of the first region 120 or of some patterned portions of the second region 122. In some embodiments, a pattern of the first region 120 or of some patterned portions of the second region 122 is different than a pattern of another of the first region 120 or of some patterned portions of the second region 122. In some embodiments, a pattern of some of the first region 120, the eighth patterned region 140, the ninth patterned region 142, and the tenth patterned region 144 is the same as a pattern of some other of the first region 120, the eighth patterned region 140, the ninth patterned region 142, and the tenth patterned region, and a pattern of some of the first region 120, the eighth patterned region 140, the ninth patterned region 142, and the tenth patterned region 144 is different than a pattern of some other of the first region 120, the eighth patterned region 140, the ninth patterned region 142, and the tenth patterned region 144. Other arrangements of patterns of the wafer 110 are within the scope of the present disclosure.

According to some embodiments, a pattern formed in the second region 122 is a dummy pattern. According to some embodiments, a dummy pattern is a pattern corresponding to or used to make a dummy device, where a dummy device is a device, element, feature, etc. not used in a resulting semiconductor device, is not part of a part of a die removed from the wafer, etc. In some embodiments, a dummy device can be thought of as a sacrificial device that is formed for one or more reasons other than to be used in a resulting semiconductor device. According to some embodiments, a pattern formed in the first region 120 is a non-dummy pattern. According to some embodiments, a non-dummy pattern is a pattern corresponding to or used to make a non-dummy device, where a non-dummy device is a device, element, feature, etc. used in a resulting semiconductor device, is part of a part of a die removed from the wafer, etc. A non-dummy device is also referred to herein as a device.

Devices formed in the first region 120 can be many different types of items, such as transistors, doped regions, vias, fins, etc. Dummy devices formed in the second region 122 can be many different types of dummy items, such as transistors, doped regions, vias, fins, etc. Devices formed in the first region 120 can vary across the first region, such as having different operating characteristics, such as threshold voltages, etc., dimensions, densities, etc. According to some embodiments, at least some dummy devices are formed in the second region 122 in consideration of variations and/or other aspects of the devices formed in the first region 120 to improve semiconductor fabrication, yield, etc., such as by counteracting, continuing, etc. aspects in the first region 120 with aspects in the second region 122. A density of dummy devices in at least a portion of the second region 122 may correspond to a density of devices in at least a portion of the first region 120, such that a pattern density in the second region 122 corresponds to or is equal to a pattern density in the first region 120. Forming dummy devices and/or dummy patterns in the second region that reflect or are in consideration of devices and/or patterns in the first region 120 improves yield and/or otherwise promotes desired results at least because some semiconductor fabrication processes, such as chemical mechanical polishing (CMP), growth processes, deposition processes, etc. can be better controlled and/or provide more predictable and/or uniform results when at least a portion of the second region 122 corresponds to at least a portion of the first region 120. A more uniform or predictable amount of material will likely be removed by a CMP process where a density of devices, such as transistors, remains relatively constant in and between at least a portion of the second region 122 and at least a portion of the first region 120 as compared to where the density of devices varies dramatically between at least a portion of the second region 122 and at least a portion of the first region 120, such as due to dishing that might occur at locations unoccupied by devices. Devices in the first region 120 will be more likely to have intended dimensions, operating characteristics, etc., thereby improving yield, where dummy devices in the second region 122 reflect, such as having the same or similar dimensions, operating characteristics, etc., the devices in the first region 120. Improved yield can correspond to more good or usable die being extracted from the wafer and/or fewer bad die, such as do not pass testing, performance, reliability, tolerance, etc. requirements, that cannot be used and/or have to be discarded.

According to some embodiments, at least one of the second patterned region 128, the third patterned region 130, the fourth patterned region 132, the fifth patterned region 134, the sixth patterned region 136, the seventh patterned region 138, the eighth patterned region 140, the ninth patterned region 142, or the tenth patterned region 144 comprise dummy patterns and are fashioned, such as in shape, size, location, density, etc., in view of one or more portions of the first region 120. The second patterned region 128 may have a dummy pattern density similar to a pattern density in a portion of the first region 120. A shape of the third patterned region 130 may have a shape similar to a shape of a patterned region in the first region 120, such as to mimic and/or reflect a layout in the first region 120. Dimensions of patterns in the fourth patterned region 132 may be similar to dimensions of patterns in a portion of the first region 120.

According to some embodiments, formation of one or more patterns, such as with regard to pattern dimensions, pattern density, etc., in the first region 120 and/or the second region 122, such as at least one of the first patterned region 126, the second patterned region 128, the third patterned region 130, the fourth patterned region 132, the fifth patterned region 134, the sixth patterned region 136, the seventh patterned region 138, the eighth patterned region 140, the ninth patterned region 142, or the tenth patterned region 144, are effected via functioning of the controller 240 and/or the lithography data source 242 as provided herein. According to some embodiments, at least some of the second region 122 and/or the first region 120 is patterned on-the-fly, in-situ, in a feed-forward, and/or in a feedback manner. As a pattern is formed in the first region 120, a measurement can be taken of that pattern, such as with regard to dimensions, density, etc. The measurements can be provided to and/or analyzed by the controller 240 and/or the lithography data source 242 and, in turn, used by the controller 240 and/or the lithography data source 242 to pattern the second region 122, such as to have similar and/or desired (e.g., larger, smaller, a multiple of, a function of, etc.) dimensions, density, etc. A pattern density in at least a portion of the second region 122 may be different than a pattern density in at least a portion of the first region 120. In some embodiments, the pattern density in at least a portion of the second region 122 is based on a process calibration curve. A process calibration curve may reflect a best or desired critical dimension or thickness matching with a portion of the first region 120, such as a center portion of the first region 120.

Figure 10:
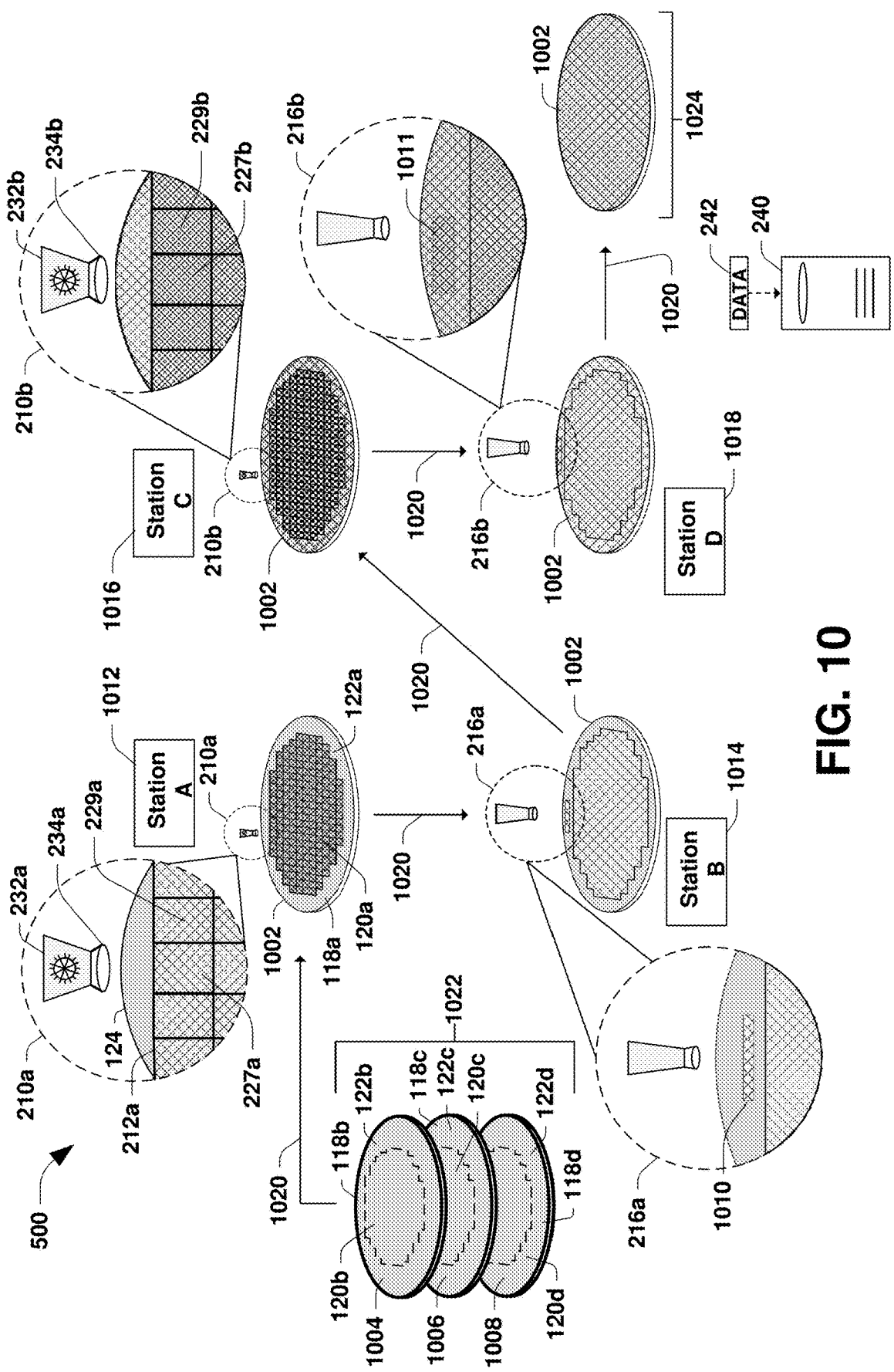
FIG. 10 illustrates a lithography system for semiconductor wafer lithography, according to some embodiments.

FIG. 10 illustrates a lithography system 500 for semiconductor wafer lithography, according to some embodiments. The lithography system 500 comprises two or more lithography stations. In the illustrated embodiment, the lithography system comprises four lithography stations: a first lithography station 1012 (referenced as "Station A"), a second lithography station 1014 (referenced as "Station B"), a third lithography station 1016 (referenced as "Station C"), and a fourth lithography station 1018 (referenced as "Station D"). In some embodiments, the first lithography station 1012 is a first photolithography station, the second lithography station 1014 is a first direct-beam write station, the third lithography station 1016 is a second photolithography station, and the fourth lithography station 1018 is a second direct-beam write station. The second lithography station 1014 and the fourth lithography station 1018 may be maskless lithography stations. The first lithography station 1012 may comprise a first wafer holder, the second lithography station 1014 may comprise a second wafer holder, the third lithography station 1016 may comprise a third wafer holder, and the fourth lithography station 1018 may comprise a fourth wafer holder. Other arrangements of lithography stations are within the scope of the present disclosure.

The lithography system 500 comprises or is in communication with the controller 240. The controller 240 may be programmed with or configured to receive lithography data from the lithography data source 242. According to some embodiments, the controller 240 communicates signals to at least one of a wafer holder 1022, the first lithography station 1012, the second lithography station 1014, the third lithography station 1016, the fourth lithography station 1018, a wafer output receiver 1024, or wafer transfer devices 1020 to implement at least some of the processes of the lithography system 500 described herein. The controller 240 may include communication connection(s) that allows the controller 240 to communicate with at least one of the wafer holder 1022, the first lithography station 1012, the second lithography station 1014, the third lithography station 1016, the fourth lithography station 1018, the wafer output receiver 1024, or the wafer transfer devices 1020. Communication connections may include, but are not limited to, a modem, a Network Interface Card (NIC), an integrated network interface, a radio frequency transmitter/receiver, an infrared port, a USB connection, and/or other interfaces for connecting the controller 240 to other computing devices. Communication connections may include a wired connection and/or a wireless connection. Communication connections may transmit and/or receive communication media. Other communication connections are within the scope of the present disclosure.

The lithography system 500 comprises the wafer transfer devices 1020 to sequentially transfer wafers from the wafer holder 1022 to the first lithography station 1012, from the first lithography station to the second lithography station 1014, from the second lithography station 1014 to the third lithography station 1016, from the third lithography station 1016 to the fourth lithography station 1018, and from the fourth lithography station to the wafer output receiver 1024, according to some embodiments. The wafer holder 1022 holds one or more wafers, such as may correspond to one or more instances of the wafer 110. In some embodiments, the wafer holder 1022 holds a first wafer 1002, a second wafer 1004, a third wafer 1006, and a fourth wafer 1008. The first lithography station 1012 and the third lithography station 1016 may be mask lithography stations, such as to form one or more patterns in one or more regions of a first layer of resist material 118a overlying the first region 120a of the first wafer 1002, to form one or more patterns in one or more regions of a second layer of resist material 118b overlying the first region 120b of the second wafer 1004, to form one or more patterns in one or more regions of a third layer of resist material 118c overlying the first region 120c of the third wafer 1006, and to form one or more patterns in one or more regions of a fourth layer of resist material 118d overlying the first region 120d of the fourth wafer 1008. The second lithography station 1014 and the fourth lithography station 1018 may be mask-less lithography stations, such as to form one or more patterns in one or more regions of the first layer of resist material 118a overlying the second region 122a of the first wafer 1002, to form one or more patterns in one or more regions of the second layer of resist material 118b overlying the second region 122b of the second wafer 1004, to form one or more patterns in one or more regions of the third layer of resist material 118c overlying the second region 122c of the third wafer 1006, and to form one or more patterns in one or more regions of the fourth layer of resist material 118d overlying the second region 122d of the fourth wafer 1008. Each station illustrates lithographic processing of only the first wafer 1002 for ease of description. Other arrangements and quantities of lithography stations are within the scope of the present disclosure.

According to some embodiments, the lithography system 500 is configured to transfer a wafer, such as the first wafer 1002, from the wafer holder 1022 to the first lithography station 1012. The first lithography station 1012 is a photolithography station comprising a first light source 210a and a first optical mask 212a to photolithographically write a first photolithographic pattern of the first optical mask 212a into the first layer of resist material 118a overlying the first region 120a of the first wafer 1002. Subsequent to writing the first photolithographic pattern into the first layer of resist material 118a overlying the first region 120a of the first wafer 1002, the lithography system 500 transfers the first wafer 1002 to the second lithography station 1014 and transfers the second wafer 1004 to the first lithography station 1012. Thus, the first wafer 1002 is located at the second lithography station 1014 concurrently with the second wafer 1004 being located at the first lithography station 1012.

The second lithography station 1014 is a direct-beam write lithography station comprising a first direct-beam writer energy source 216a to direct-beam write a first direct-beam lithographic pattern 1010 into the first layer of resist material 118a overlying the second region 122a of the first wafer 1002. According to some embodiments, the second lithography station 1014 direct-beam writes the first direct-beam lithographic pattern 1010 into the first layer of resist material 118a overlying the second region 122a of the first wafer 1002 while the first lithography station 1012 photolithographically writes the first photolithographic pattern of the first optical mask 212a into the second layer of resist material 118b overlying the first region 120b of the second wafer 1004.

As disclosed, the lithography system 500 comprises the first lithography station 1012 comprising the first light source 210a and the first optical mask 212a to photolithographically write the first photolithographic pattern of the first optical mask 212a into the first layer of resist material 118a overlying the first region 120a of the first wafer 1002. The lithography system 500 comprises the second lithography station 1014 comprising the first direct-beam writer energy source 216a to direct-beam write the first direct-beam lithographic pattern 1010 into the first layer of resist material 118a overlying the second region 122a of the first wafer 1002.

Advantageously, the first region 120b of the second wafer 1004 is photolithographically written to at the first lithography station 1012 concurrent with direct-beam writing the second region 122a of the first wafer 1002 at the second lithography station 1014. Because the first wafer 1002 is transferred to the second lithography station 1014 for writing the mask-less lithographic pattern in the second region 122a of the first wafer 1002, the amount of time the first wafer 1002 occupies the first lithography station 1012 is reduced, compared to systems in which all regions of a wafer are written to at a single station, such as the first lithography station 1012.

Subsequent to direct-beam writing the first direct-beam lithographic pattern 1010 into the first layer of resist material 118a overlying the second region 122a of the first wafer 1002 at the second lithography station 1014 and photolithographically writing the first photolithographic pattern of the first optical mask 212a into the second layer of resist material 118b overlying the first region 120b of the second wafer 1004 at the first lithography station 1012, the lithography system 500 transfers the first wafer 1002 to the third lithography station 1016, transfers the second wafer 1004 to the second lithography station 1014, and transfers the third wafer 1006 from the wafer holder 1022 to the first lithography station 1012, according to some embodiments. The first lithography station 1012 photolithographically writes the first photolithographic pattern of the first optical mask 212a into the third layer of resist material 118c overlying the first region 120c of the third wafer 1006. The second lithography station 1014 direct-beam writes the first direct-beam lithographic pattern 1010 into the second layer of resist material 118b overlying the second region 122b of the second wafer 1004. And, the third lithography station 1016 writes a second photolithographic pattern of a second optical mask 212b into the first layer of resist material 118a overlying the first region 120a of the first wafer 1002. The third lithography station 1016 is a photolithography station comprising a second light source 210b and the second optical mask 212b to photolithographically write the second photolithographic pattern of the second optical mask 212b into the first layer of resist material 118a overlying the first region 120a of the first wafer 1002. At least two of the foregoing operations occur concurrently.

Subsequent to writing the second photolithographic pattern into the first layer of resist material 118a overlying the first region 120a of the first wafer 1002, direct-beam writing the first direct-beam lithographic pattern 1010 into the second layer of resist material 118b overlying the second region 122b of the second wafer 1004, and writing the first photolithographic pattern into the third layer of resist material 118c overlying the first region 120c of the third wafer 1006, the lithography system 500 transfers the first wafer 1002 to the fourth lithography station 1018, transfers the second wafer 1004 to the third lithography station 1016, transfers the third wafer 1006 to the second lithography station 1014, and transfers the fourth wafer 1008 from the wafer holder 1022 to the first lithography station 1012, according to some embodiments.

At the first lithography station 1012, the first photolithographic pattern of the first optical mask 212a is photolithographically written into the fourth layer of resist material 118d overlying the first region 120d the fourth wafer 1008. At the second lithography station 1014, the first direct-beam lithographic pattern 1010 is direct-beam written into the third layer of resist material 118c overlying the second region 122c of the third wafer 1006. At the third lithography station 1016, the second photolithographic pattern of the second optical mask 212b is photolithographically written into the second layer of resist material 118b overlying the first region 120b of the second wafer 1004. At the fourth lithography station 1018, a second direct-beam lithographic pattern 1011 is direct-beam written into the first layer of resist material 118a overlying the second region 122a of the first wafer 1002, according to some embodiments. The fourth lithography station 1018 is a direct-beam write lithography station comprising a second direct-beam writer energy source 216b to direct-beam write the second direct-beam lithographic pattern 1011 into the first layer of resist material 118a overlying the second region 122a of the first wafer 1002.

The lithography system 500 transfers the first wafer 1002 to the wafer output receiver 1024 or to a fifth lithography station (not shown) after the fourth lithography station 1018 direct-beam writes the second direct-beam lithographic pattern 1011 into the first layer of resist material 118a overlying the second region 122a of the first wafer 1002.

According to some embodiments, the wafer transfer devices 1020 transfer the second wafer 1004 from the wafer holder 1022 to the first lithography station 1012 while and/or after the wafer transfer devices 1020 transfer the first wafer 1002 from the first lithography station 1012 to the second lithography station 1014. The wafer transfer devices 1020 transfer the third wafer 1006 from the wafer holder 1022 to the first lithography station 1012 while and/or after the wafer transfer devices 1020 transfer the second wafer 1004 from the first lithography station 1012 to the second lithography station 1014 and while and/or after the wafer transfer devices 1020 transfer the first wafer 1002 from the second lithography station 1014 to the third lithography station 1016. The wafer transfer devices 1020 transfer the fourth wafer 1008 from the wafer holder 1022 to the first lithography station 1012 while and/or after the wafer transfer devices 1020 transfer the third wafer 1006 from the first lithography station 1012 to the second lithography station 1014, while and/or after the wafer transfer devices 1020 transfer the second wafer 1004 from the second lithography station 1014 to the third lithography station 1016, and while and/or after the wafer transfer devices 1020 transfer the first wafer 1002 from the third lithography station 1016 to the fourth lithography station 1018. Other series and/or timings of wafer transfer are within the scope of the present disclosure.

According to some embodiments, the lithography system 500 concurrently lithographically processes different wafers at different stations. In one or more embodiments, the lithography system 500 concurrently lithographically processes the second wafer 1004 at the first lithography station 1012 and the first wafer 1002 at the second lithography station 1014. In one or more embodiments, the lithography system 500 concurrently lithographically processes the third wafer 1006 at the first lithography station 1012, the second wafer 1004 at the second lithography station 1014, and the first wafer 1002 at the third lithography station 1016. In one or more embodiments, the lithography system 500 concurrently lithographically processes the fourth wafer 1008 at the first lithography station 1012, the third wafer 1006 at the second lithography station 1014, the second wafer 1004 at the third lithography station 1016, and the first wafer 1002 at the fourth lithography station 1018. Other series and/or timings of lithographic processing of wafers at different stations are within the scope of the present disclosure.

According to some embodiments, the first optical mask 212a comprises one or more photolithographic die patterns, such as a first photolithographic die pattern 227a, a second photolithographic die pattern 229a, etc. In some embodiments, relative movement is established between at least two of a first light emitter 232a, a first optical device 234a, the first optical mask 212a, and the first wafer 1002 to transfer the one or more photolithographic die patterns of the first optical mask 212a into the first layer of resist material 118a overlying the first region 120a of the first wafer 1002. In some embodiments, the photolithographic die patterns of the first optical mask 212a are transferred all at once into the first layer of resist material 118a overlying the first region 120a of the first wafer 1002. In some embodiments, one or more, but fewer than all, of the photolithographic die patterns of the first optical mask 212a are transferred at a time into the first layer of resist material 118a overlying the first region 120a of the first wafer 1002, such as in a step and shoot or scan and shoot manner.

According to some embodiments, the second optical mask 212b comprises one or more photolithographic die patterns, such as a first photolithographic die pattern 227b, a second photolithographic die pattern 229b, etc. In some embodiments, relative movement is established between at least two of a second light emitter 232b, a second optical device 234b, the second optical mask 212b, and the first wafer 1002 to transfer the one or more photolithographic die patterns of the second optical mask 212b into the first layer of resist material 118a overlying the first region 120a of the first wafer 1002. In some embodiments, the photolithographic die patterns of the second optical mask 212b are transferred all at once into the first layer of resist material 118a overlying the first region 120a of the first wafer 1002. In some embodiments, one or more, but fewer than all, of the photolithographic die patterns of the second optical mask 212b are transferred at a time into the first layer of resist material 118a overlying the first region 120a of the first wafer 1002, such as in a step and shoot manner where a first pattern transfer occurs into a first location of the first layer of resist material 118a overlying the first region 120a of the first wafer 1002, first relative movement occurs, a second pattern transfer occurs into a second location of the first layer of resist material 118a overlying the first region 120a of the first wafer 1002, second relative movement occurs, a third pattern transfer occurs into a third location of the first layer of resist material 118a overlying the first region 120a of the first wafer 1002, etc.

At the second lithography station 1014, the lithography system 500 direct-beam writes the first direct-beam lithographic pattern 1010 and one or more other direct-beam lithographic patterns (not shown) into the first layer of resist material 118a overlying the second region 122a the first wafer 1002. In some embodiments, relative movement is established between the first direct-beam writer energy source 216a and the first wafer 1002 to write one or more direct-beam lithographic pattern(s) into the first layer of resist material 118a overlying the second region 122a the first wafer 1002. In some embodiments, the one or more direct-beam lithographic pattern(s) are written all at once into the first layer of resist material 118a overlying the second region 122a of the first wafer 1002. In some embodiments, one or more, but fewer than all, of the one or more direct-beam lithographic pattern(s) are written at a time into the first layer of resist material 118a overlying the second region 122a of the first wafer 1002, such as in a step and shoot manner where a first write occurs into a first location of the first layer of resist material 118a overlying the second region 122a of the first wafer 1002, first relative movement occurs, a second write occurs into a second location of the first layer of resist material 118a overlying the second region 122a of the first wafer 1002, second relative movement occurs, a third write occurs into a third location of the first layer of resist material 118a overlying the second region 122a of the first wafer 1002, etc.

At the fourth lithography station 1018, the lithography system 500 direct-beam writes the second direct-beam lithographic pattern 1011 and one or more other direct-beam lithographic patterns (not shown) into the first layer of resist material 118a overlying the second region 122a the first wafer 1002. In some embodiments, relative movement is established between the second direct-beam writer energy source 216b and the first wafer 1002 to write one or more direct-beam lithographic pattern(s) into the first layer of resist material 118a overlying the second region 122a the first wafer 1002. In some embodiments, the one or more direct-beam lithographic pattern(s) are written all at once into the first layer of resist material 118a overlying the second region 122a of the first wafer 1002. In some embodiments, one or more, but fewer than all, of the one or more direct-beam lithographic pattern(s) are written at a time into the first layer of resist material 118a overlying the second region 122a of the first wafer 1002, such as in a step and shoot manner where a first write occurs into a first location of the first layer of resist material 118a overlying the second region 122a of the first wafer 1002, first relative movement occurs, a second write occurs into a second location of the first layer of resist material 118a overlying the second region 122a of the first wafer 1002, second relative movement occurs, a third write occurs into a third location of the first layer of resist material 118a overlying the second region 122a of the first wafer 1002, etc. Processing times are reduced and/or efficiencies are realized by concurrently processing one or more wafers in different stations, as compared to completely processing one wafer before processing another wafer.

Figure 11:
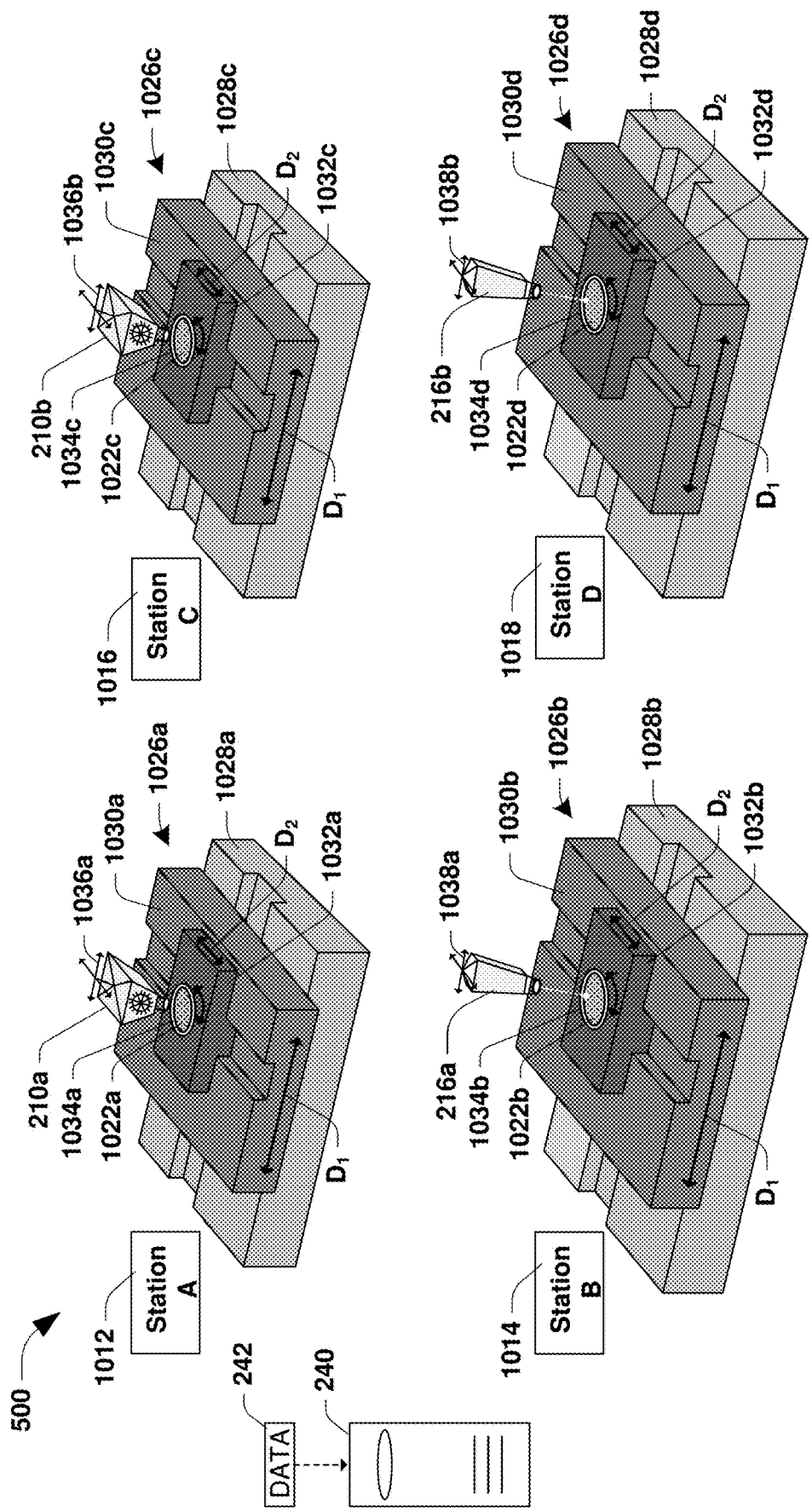
FIG. 11 illustrates a lithography system for semiconductor wafer lithography, according to some embodiments.

FIG. 11 illustrates the lithography system 500, according to some embodiments. The lithography system 500 comprises the first lithography station 1012, the second lithography station 1014, the third lithography station 1016, and the fourth lithography station 1018. At least one lithography station comprises a wafer orientator 1026 to position, shift, transfer, and/or orient a wafer holder 1022 at least one of before, during, or after photolithographic patterning and/or direct-writing. The wafer orientator 1026 comprises the wafer holder 1022, a base 1028, a first lateral-direction transporter 1030 to move the wafer holder 1022 along first directions $D_1$, and a second lateral-direction transporter 1032 to move the wafer holder 1022 along second directions $D_2$. According to some embodiments, the second directions $D_2$ are perpendicular to the first directions $D_1$. The wafer orientator 1026 may comprise a rotator 1034 coupled to the wafer holder 1022. The wafer orientator 1026 may rotate and/or revolve the wafer holder 1022 about at least one point at least one of before, during, or after photolithographic patterning and/or direct-writing.

According to some embodiments, the first lithography station 1012 comprises the first light source 210a and a first light source conveyer 1036a, the second lithography station 1014 comprises the first direct-beam writer energy source 216a and a first energy source conveyer 1038a, the third lithography station 1016 comprises the second light source 210b and a second light source conveyer 1036b, and the fourth lithography station 1018 comprises the second direct-beam writer energy source 216b and a second energy source conveyer 1038b. To control at least some operations the lithography system 500 includes the controller 240 and the lithography data source 242, wherein at least one of the first lithography station 1012, the second lithography station 1014, the third lithography station 1016, or the fourth lithography station 1018 sends and/or receives photolithography pattern signals and/or direct-beam write signals from the controller 240. The controller 240 may be programmed with or configured to receive lithography data from the lithography data source 242 and generate the photolithography pattern signals and/or direct-beam write signals. The controller 240 may receive signals indicative of measurements, progress, etc. related to photolithographic patterning and/or direct-writing, such as feedback signals. Such received signals may be part of the lithography data source 242 and/or may be used to adjust, control, etc. photolithographic patterning and/or direct-writing, such as in a feedforward matter, in-situ, etc., such as to adjust light intensity, light duration, energy intensity, energy duration, direction of (relative) movement, etc.

According to some embodiments, the wafer orientator 1026 comprises at least some of the components depicted with respect to FIG. 1 and/or FIG. 2 and/or at least some of the wafer orientator 1026 corresponds to at least some of the components depicted with respect to FIG. 1 and/or FIG. 2. In some embodiments, at least one of the wafer holder 1022, the base 1028, the first lateral-direction transporter 1030, the second lateral-direction transporter 1032, the rotator 1034, the first light source conveyer 1036a, the first energy source conveyer 1038a, the second light source conveyer 1036b, or the second energy source conveyer 1038b corresponds to at least one of the first wafer holder 108, the second wafer holder 206, the spin coater 106, the dispenser 116, the first conveyer 208, the second conveyer 214, or the third conveyer 218. Other configurations of lithography stations are within the scope of the present disclosure.

Figure 12:
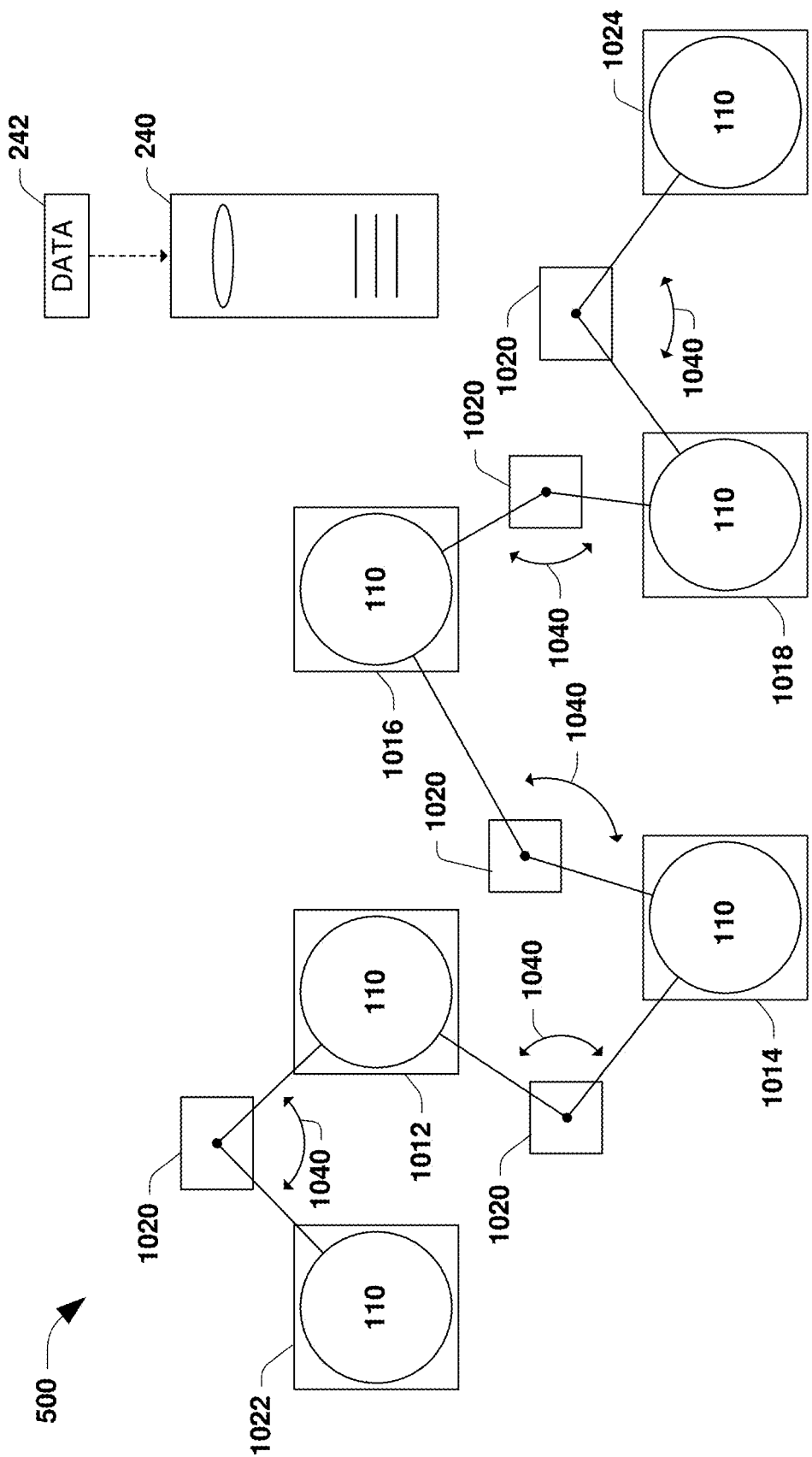
FIG. 12 illustrates a lithography system for semiconductor wafer lithography, according to some embodiments.

FIG. 12 illustrates the lithography system 500, according to some embodiments. The lithography system 500 comprises the wafer transfer devices 1020 to transfer wafers 110, such as the first wafer 1002, the second wafer 1004, the third wafer 1006, and/or the fourth wafer 1008, from the wafer holder 1022 to the first lithography station 1012, from the first lithography station 1012 to the second lithography station 1014, from the second lithography station 1014 to the third lithography station 1016, from the third lithography station 1016 to the fourth lithography station 1018, and from the fourth lithography station 1018 to the wafer output receiver 1024. At least one of the wafer transfer devices 1020 receives wafer transfer control signals from the controller 240 to control transfer 1040 of the wafer 110 through the lithography system 500. According to some embodiments, the wafer transfer devices 1020 receive wafer transfer signals from the controller 240. The controller 240 may be programmed with or configured to receive wafer transfer signals from the lithography data source 242 and generate the wafer transfer control signals. Other configurations of wafer transfer devices are within the scope of the present disclosure.

Figure 13:
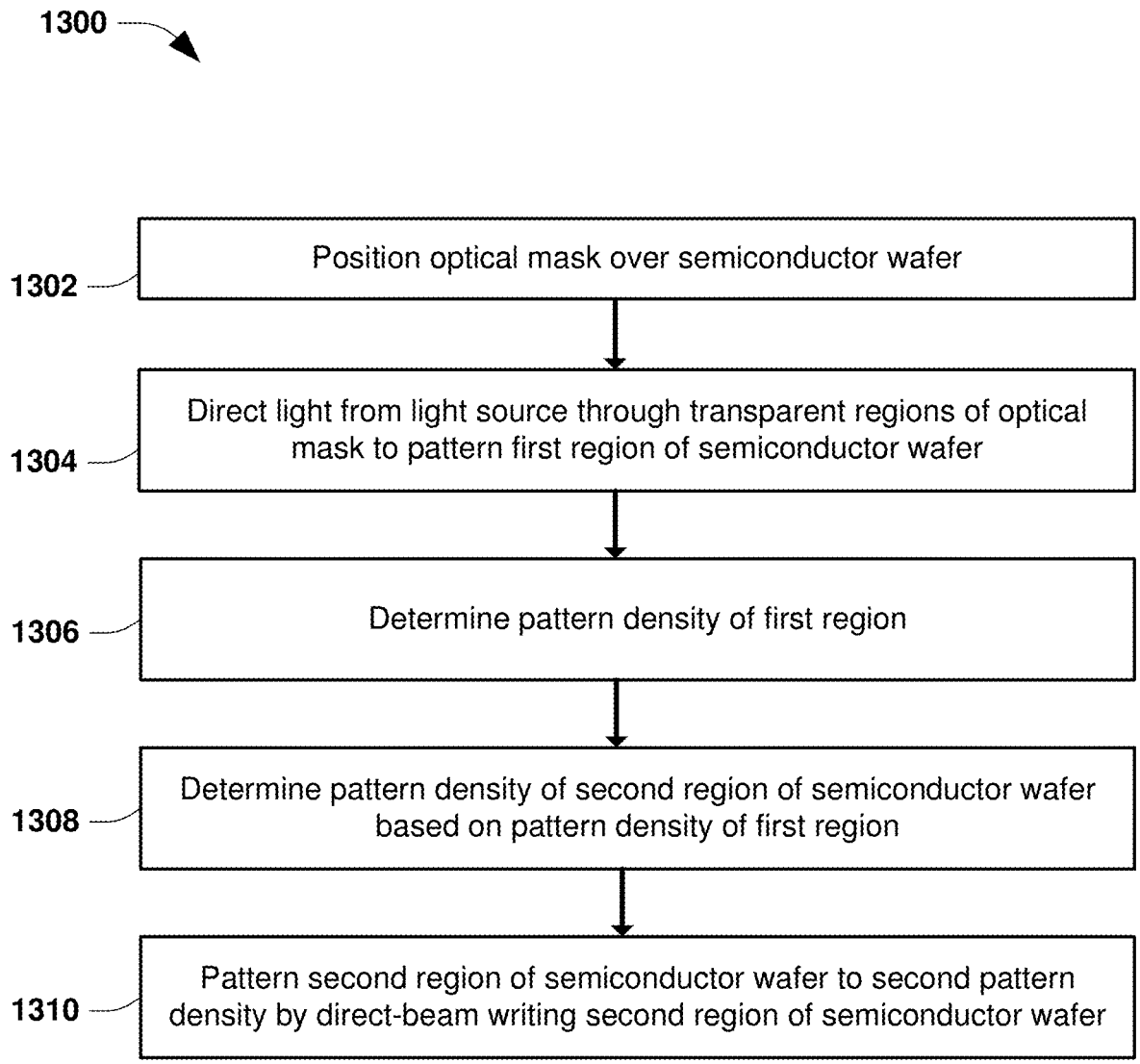
FIG. 13 illustrates a method of semiconductor wafer lithography, according to some embodiments.

FIG. 13 is an illustration of a method 1300 of semiconductor wafer lithography, according to some embodiments. The method comprises positioning an optical mask over a semiconductor wafer (1302). Light is directed from a light source through transparent regions of an optical mask over the semiconductor wafer to pattern a first region of the semiconductor wafer (1304). A pattern density of the first region is determined (1306). A pattern density of a second region of the semiconductor wafer is determined based on the pattern density of the first region (1308), such as to be the same as, similar to, a multiple of, a function of, etc. the pattern density of the first region. The second region of the semiconductor wafer is patterned with the determined second pattern density by direct-beam mask-less writing the second pattern density to the second region (1310). In some embodiments, the second region is dummy patterned.

Figure 14:
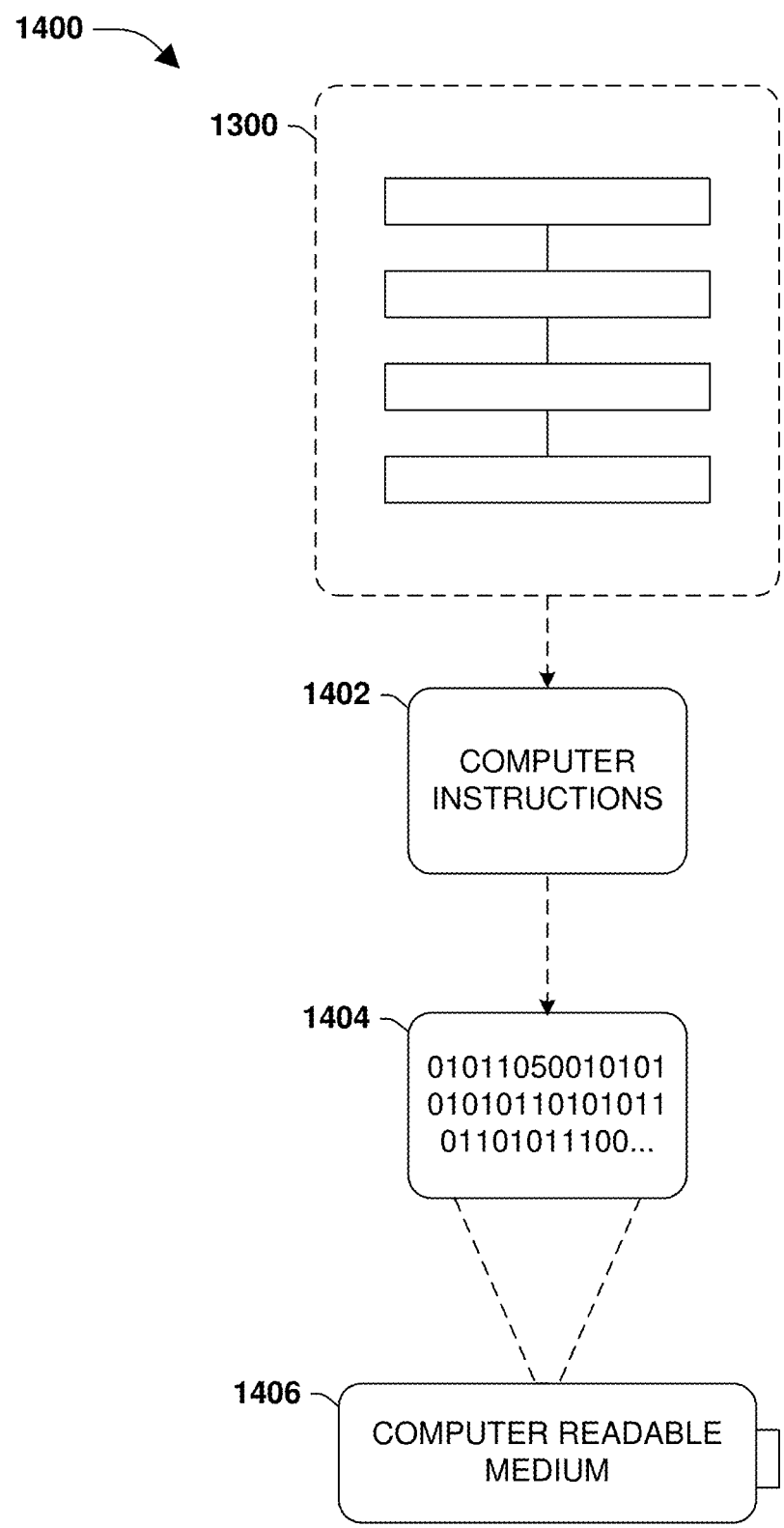
FIG. 14 illustrates an exemplary computer-readable medium, according to some embodiments.

FIG. 14 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 14, wherein the embodiment 1400 comprises a computer-readable medium 1406 (e.g., a CD-R, DVD-R, flash drive, a platter of a hard disk drive, etc.), on which is encoded computer-readable data 1404. This computer-readable data 1404 in turn comprises a set of processor-executable computer instructions 1402 that when executed are configured to facilitate operations according to one or more of the principles set forth herein. In some embodiments 1400, the processor-executable computer instructions 1402, when executed, are configured to facilitate performance of a method 1300, such as at least some of the aforementioned method(s). In some embodiments, the processor-executable computer instructions 1402, when executed, are configured to facilitate implementation of a system, such as at least some of the one or more aforementioned system(s). Many such computer-readable media may be devised by those of ordinary skill in the art that are configured to operate in accordance with the techniques presented herein.

Figure 15:
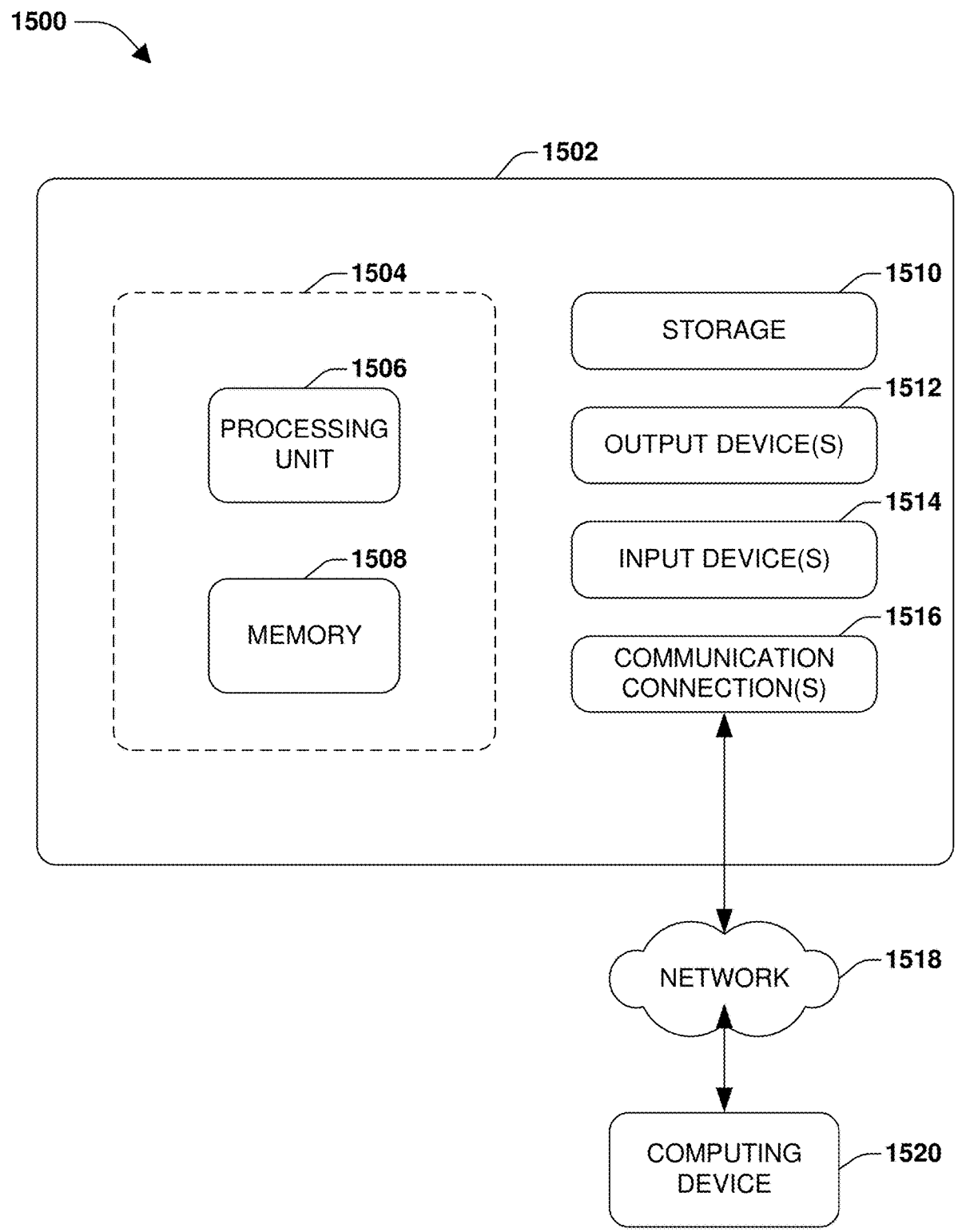
FIG. 15 illustrates an example computing environment wherein one or more of the provisions set forth herein may be implemented, according to some embodiments.

FIG. 15 illustrates an example computing environment wherein one or more of the provisions set forth herein may be implemented, according to some embodiments. FIG. 15 and the following discussion provide a brief, general description of a suitable computing environment to implement embodiments of one or more of the provisions set forth herein. The computing environment of FIG. 15 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 15 depicts an example of a system 1500 comprising a computing device 1502 configured as the controller 240 to implement embodiments provided herein. In some configurations, computing device 1502 includes at least one processing unit 1506 and memory 1508. Depending on the exact configuration and type of computing device, memory 1508 may be volatile (such as RAM, for example), non-volatile (such as ROM, flash memory, etc., for example) or some combination of the two. This configuration is illustrated in FIG. 15 by dashed line 1504.

In some embodiments, computing device 1502 may include additional features and/or functionality. For example, computing device 1502 may also include additional storage (e.g., removable and/or non-removable) including, but not limited to, magnetic storage, optical storage, and the like. Such additional storage is illustrated in FIG. 15 by storage 1510. In some embodiments, computer readable instructions to implement one or more embodiments provided herein may be in storage 1510. Storage 1510 may also store other computer readable instructions to implement an operating system, an application program, and the like. Computer readable instructions may be loaded in memory 1508 for execution by processing unit 1506, for example.

The term "computer readable media" as used herein includes computer storage media. Computer storage media includes volatile and nonvolatile, removable and non-removable media implemented in any method or technology for storage of information such as computer readable instructions or other data. Memory 1508 and storage 1510 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1502. Any such computer storage media may be part of computing device 1502.

Computing device 1502 may also include communication connection(s) 1516 that allows computing device 1502 to communicate with other devices. Communication connection(s) 1516 may include, but is not limited to, a modem, a Network Interface Card (NIC), an integrated network interface, a radio frequency transmitter/receiver, an infrared port, a USB connection, or other interfaces for connecting computing device 1502 to other computing devices. Communication connection(s) 1516 may include a wired connection or a wireless connection. Communication connection(s) 1516 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1502 may include input device(s) 1514 such as keyboard, mouse, pen, voice input device, touch input device, infrared cameras, video input devices, and/or any other input device. Output device(s) 1512 such as one or more displays, speakers, printers, and/or any other output device may also be included in computing device 1502. Input device(s) 1514 and output device(s) 1512 may be connected to computing device 1502 via a wired connection, wireless connection, or any combination thereof. In some embodiments, an input device or an output device from another computing device may be used as input device(s) 1514 or output device(s) 1512 for computing device 1502.

Components of computing device 1502 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1502 may be interconnected by a network. For example, memory 1508 may be comprised of multiple physical memory units located in different physical locations interconnected by a network.

Those skilled in the art will realize that storage devices utilized to store computer readable instructions may be distributed across a network. For example, a computing device 1520 accessible via a network 1518 may store computer readable instructions to implement one or more embodiments provided herein. Computing device 1502 may access computing device 1520 and download a part or all of the computer readable instructions for execution. Alternatively, computing device 1502 may download pieces of the computer readable instructions, as needed, or some instructions may be executed at computing device 1502 and some at computing device 1520.

According to some embodiments, a lithography method to pattern a first semiconductor wafer includes positioning an optical mask over the first semiconductor wafer, patterning a first region of the first semiconductor wafer by directing light from a light source through transparent regions of the optical mask, and patterning a second region of the first semiconductor wafer by directing energy from an energy source to the second region. According to some embodiments, the patterning of the second region includes direct-beam writing.

According to some embodiments the patterning of the first region includes patterning the first region at a first lithography station in a lithography system, and the patterning of the second region includes patterning the second region at a second lithography station in the lithography system, different from the first lithography station.

According to some embodiments, one of the first region or the second region is patterned before patterning the other of the first region or the second region.

According to some embodiments, the second region encircles the first region.

According to some embodiments, the second region is an exclusion zone between a border of the first region and an edge of the first semiconductor wafer.

According to some embodiments, the lithography method includes determining a first pattern density of a portion of the first region and patterning the second region to a second pattern density. According to some embodiments, the first pattern density and the second pattern density are the same pattern density.

According to some embodiments, the patterning of the second region includes forming a dummy pattern.

According to some embodiments, the lithography method includes patterning a third region of the first semiconductor wafer by directing energy from the energy source to the third region. According to some embodiments, the patterning of the third region includes direct-beam writing, wherein a pattern density of the second region is a first dummy pattern density, a pattern density of the third region is a second dummy pattern density, and the second dummy pattern density is different than the first dummy pattern density.

According to some embodiments the lithography method includes concurrently patterning the second region and a third region of a second semiconductor wafer.

According to some embodiments, for a patterned semiconductor wafer produced by a process, the process includes patterning at least some of a semiconductor wafer by exposing the semiconductor wafer to a light source at a first semiconductor wafer holder, transferring the semiconductor wafer from the first semiconductor wafer holder to a second semiconductor wafer holder, and patterning at least some of the semiconductor wafer by exposing the semiconductor wafer to an energy beam from a direct-beam writer at the second semiconductor wafer holder.

According to some embodiments, the process includes determining a pattern density of a region of the semiconductor wafer.

According to some embodiments, the process includes deriving write commands based on the pattern density and communicating the write commands to the direct-beam writer.

According to some embodiments, the process includes directing the energy beam to a region of the semiconductor wafer to write a lithographic dummy pattern on the region.

According to some embodiments, the patterning of at least some of the semiconductor wafer by exposing the semiconductor wafer to the light source includes directing light from the light source through transparent regions of an optical mask.

According to some embodiments, the patterning of at least some of the semiconductor wafer by exposing the semiconductor wafer to the energy beam from the direct-beam writer includes writing a dummy pattern between a border of a region of the semiconductor wafer and an edge of the semiconductor wafer.

According to some embodiments, a method to write a lithographic dummy pattern on a semiconductor wafer includes patterning a first region of the semiconductor wafer by directing light from a light source through transparent regions of an optical mask to the first region, determining a pattern density of the first region, and patterning a second region of the semiconductor wafer by directing energy from an energy source to the second region to write the lithographic dummy pattern on the second region. According to some embodiments, a pattern density of the lithographic dummy pattern is based on the pattern density of the first region.

According to some embodiments, the pattern density of the lithographic dummy pattern and the pattern density of the first region are a same density.

According to some embodiments, the second region is between a border of the first region and an edge of the semiconductor wafer.

According to some embodiments, the second region encircles the first region.

According to some embodiments, writing the lithographic dummy pattern on a semiconductor wafer includes transferring the semiconductor wafer from a first wafer lithography station to a second wafer lithography station after patterning the first region and before patterning the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A lithography system configured to pattern a first semiconductor wafer, comprising:
   a first lithography station comprising a light source and configured to pattern a first region of the first semiconductor wafer by directing light from the light source at a region of an optical mask positioned over the first semiconductor wafer;
   a second lithography station, different from the first lithography station, comprising an energy source and configured to pattern a second region of the first semiconductor wafer by direct-beam writing, in which the second lithography station directs energy from the energy source to the second region; and
   a controller configured to determine a pattern density of the first region, derive write commands based on the pattern density of the first region, and communicate the write commands to the second lithography station.

2. The lithography system of claim 1, wherein the second region encircles the first region.

3. The lithography system of claim 1, wherein the second region is an exclusion zone between a border of the first region and an edge of the first semiconductor wafer.

4. The lithography system of claim 1, wherein the controller is configured to determine a pattern density for the second region based on the pattern density of the first region.

5. The lithography system of claim 4, wherein the second lithography station is configured to pattern the second region based upon the pattern density for the second region as determined by the controller.

6. The lithography system of claim 1, wherein the second lithography station is configured to pattern the second region to form a dummy pattern.

7. The lithography system of claim 1, comprising:
   a third lithography station, different from the first lithography station and the second lithography station, and configured to pattern a third region of the first semiconductor wafer by the direct-beam writing.

8. The lithography system of claim 7, wherein:
a pattern density of the second region is a first dummy pattern density,
a pattern density of the third region is a second dummy pattern density, and
the second dummy pattern density is different than the first dummy pattern density.

9. The lithography system of claim 1, comprising:
a third lithography station, different from the first lithography station and the second lithography station, and configured to pattern a third region of a second semiconductor wafer concurrently with the second lithography station patterning the second region of the first semiconductor wafer.

10. A lithography system configured to pattern a first semiconductor wafer, comprising:
a light source configured to direct light from the light source through a region of an optical mask to a first region of the first semiconductor wafer to pattern the first region;
a controller configured to determine a pattern density of the first region and determine a pattern density for a second region of the first semiconductor wafer based on the pattern density of the first region; and
a first energy source configured to direct energy from the first energy source to the second region to pattern the second region according to the pattern density for the second region determined by the controller.

11. The lithography system of claim 10, comprising:
a wafer transfer device configured to transfer the first semiconductor wafer between the light source directing the light to the first region and the first energy source directing the energy to the second region.

12. The lithography system of claim 10, comprising:
a first lithography station comprising the light source,
a second lithography station comprising the first energy source, and
a wafer transfer device configured to transfer the first semiconductor wafer between the first lithography station and the second lithography station.

13. The lithography system of claim 10, wherein the second region is an exclusion zone between a border of the first region and an edge of the first semiconductor wafer.

14. The lithography system of claim 10, comprising a second energy source configured to direct second energy from the second energy source to a third region of the first semiconductor wafer to pattern the third region after the first energy source patterns the second region.

15. The lithography system of claim 10, comprising a second energy source configured to direct second energy from the second energy source to a third region of a second semiconductor wafer to pattern the third region concurrently with the first energy source patterning the second region.

16. A lithography system configured to pattern a first semiconductor wafer, comprising:
a wafer holder configured to store a plurality of semiconductor wafers;
a first lithography station configured to receive a first semiconductor wafer of the plurality of semiconductor wafers from the wafer holder and pattern a first region of the first semiconductor wafer according to a first lithography process; and
a second lithography station configured to receive the first semiconductor wafer from the first lithography station after the first lithography process is complete and pattern a second region of the first semiconductor wafer according to a second lithography process different from the first lithography process, wherein:
the first lithography station is configured to receive a second semiconductor wafer of the plurality of semiconductor wafers from the wafer holder and pattern a first region of the second semiconductor wafer according to the first lithography process concurrently with the second lithography station patterning the second region of the first semiconductor wafer according to the second lithography process.

17. The lithography system of claim 16, comprising:
a wafer transfer device configured to transfer the first semiconductor wafer between the first lithography station and the second lithography station.

18. The lithography system of claim 16, comprising:
a controller configured to determine a pattern density of the first region of the first semiconductor wafer and determine a pattern density for the second region of the first semiconductor wafer based on the pattern density of the first region of the first semiconductor wafer.

19. The lithography system of claim 18, wherein the second lithography station is configured to pattern the second region of the first semiconductor wafer based upon the pattern density for the second region of the first semiconductor wafer as determined by the controller.

20. The lithography system of claim 16, comprising:
a controller configured to determine a pattern density of the first region, derive write commands based on the pattern density of the first region, and communicate the write commands to the second lithography station.

* * * * *